United States Patent
Aoi et al.

(10) Patent No.: US 9,660,046 B2
(45) Date of Patent: May 23, 2017

(54) METHOD OF MANUFACTURING SEMICONDUCTOR DEVICE

(71) Applicants: KABUSHIKI KAISHA TOYOTA CHUO KENKYUSHO, Nagakute-shi, Aichi-ken (JP); TOYOTA JIDOSHA KABUSHIKI KAISHA, Toyota-shi, Aichi-ken (JP); DENSO CORPORATION, Kariya-shi, Aichi-ken (JP)

(72) Inventors: Sachiko Aoi, Nagoya (JP); Yukihiko Watanabe, Nagoya (JP); Katsumi Suzuki, Nagakute (JP); Shoji Mizuno, Okazaki (JP)

(73) Assignees: KABUSHIKI KAISHA TOYOTA CHUO KENKYUSHO, Nagakute (JP); TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 14/438,824

(22) PCT Filed: Jan. 9, 2014

(86) PCT No.: PCT/JP2014/000060
§ 371 (c)(1),
(2) Date: Apr. 27, 2015

(87) PCT Pub. No.: WO2014/115494
PCT Pub. Date: Jul. 31, 2014

(65) Prior Publication Data
US 2015/0263130 A1    Sep. 17, 2015

(30) Foreign Application Priority Data

Jan. 25, 2013  (JP) ................. 2013-011918

(51) Int. Cl.
*H01L 21/332*  (2006.01)
*H01L 29/66*   (2006.01)
(Continued)

(52) U.S. Cl.
CPC .... *H01L 29/66348* (2013.01); *H01L 29/0847* (2013.01); *H01L 29/1095* (2013.01);
(Continued)

(58) Field of Classification Search
None
See application file for complete search history.

(56) References Cited

U.S. PATENT DOCUMENTS 8,283,721 B2 * 10/2012 Nakano ............... H01L 29/0623
                                                257/330
8,680,607 B2 *  3/2014 Zeng ..................... H01L 29/407
                                                257/327
(Continued)

FOREIGN PATENT DOCUMENTS

CN    101981701 A       2/2011
EP      1965436 A2 *   9/2008  ....... H01L 29/41766
(Continued)

OTHER PUBLICATIONS

Apr. 29, 2016 Office Action issued in Korean Application No. 10-2015-7014119.
(Continued)

*Primary Examiner* — David E Graybill
(74) *Attorney, Agent, or Firm* — Oliff PLC

(57) ABSTRACT

A method of manufacturing a semiconductor device includes: forming a first trench in a first area of a drift layer that has a surface including the first area and a second area; growing a crystal of a p-type base layer on a surface of the drift layer after forming the first trench; and growing a crystal of an n-type source layer on a surface of the base
(Continued)

layer. Material of the drift layer, the base layer, and the source layer are a wide-gap semiconductor.

8 Claims, 28 Drawing Sheets

(51) Int. Cl.
 *H01L 29/78*  (2006.01)
 *H01L 29/10*  (2006.01)
 *H01L 29/739*  (2006.01)
 *H01L 29/16*  (2006.01)
 *H01L 29/417*  (2006.01)
 *H01L 29/08*  (2006.01)
 *H01L 29/20*  (2006.01)
 *H01L 29/06*  (2006.01)

(52) U.S. Cl.
 CPC .. *H01L 29/66045* (2013.01); *H01L 29/66068* (2013.01); *H01L 29/66333* (2013.01); *H01L 29/66727* (2013.01); *H01L 29/66734* (2013.01); *H01L 29/7395* (2013.01); *H01L 29/7397* (2013.01); *H01L 29/7802* (2013.01); *H01L 29/7811* (2013.01); *H01L 29/7813* (2013.01); *H01L 29/0619* (2013.01); *H01L 29/0865* (2013.01); *H01L 29/0869* (2013.01); *H01L 29/1602* (2013.01); *H01L 29/1608* (2013.01); *H01L 29/2003* (2013.01); *H01L 29/41766* (2013.01)

(56) References Cited

U.S. PATENT DOCUMENTS

| | | | | |
|---|---|---|---|---|
| 8,907,408 | B2* | 12/2014 | Sedlmaier | H01L 21/765 257/329 |
| 9,184,286 | B2* | 11/2015 | Nakano | H01L 21/8213 |
| 9,355,957 | B2* | 5/2016 | Poelzl | H01L 29/66666 |
| 9,368,616 | B2* | 6/2016 | Nakano | H01L 29/41766 |
| 2006/0108634 | A1 | 5/2006 | Miura | |
| 2006/0270103 | A1* | 11/2006 | Das | H01L 29/0873 438/105 |
| 2008/0203398 | A1* | 8/2008 | Harris | H01L 29/41766 257/77 |
| 2009/0194772 | A1* | 8/2009 | Stum | H01L 29/1095 257/77 |
| 2009/0209098 | A1* | 8/2009 | Su | H01L 21/2855 438/653 |
| 2009/0261351 | A1* | 10/2009 | Das | H01L 29/0873 257/77 |
| 2010/0041195 | A1* | 2/2010 | Harris | H01L 29/41766 438/268 |
| 2010/0066440 | A1* | 3/2010 | Juengling | H01L 29/7851 327/537 |
| 2011/0024831 | A1* | 2/2011 | Nakano | H01L 29/0623 257/330 |
| 2011/0136310 | A1* | 6/2011 | Grivna | H01L 29/407 438/270 |
| 2012/0068262 | A1* | 3/2012 | Pan | H01L 29/66734 257/332 |
| 2012/0184094 | A1* | 7/2012 | Yamada | H01L 29/45 438/586 |
| 2012/0228638 | A1* | 9/2012 | Das | H01L 29/0873 257/77 |
| 2012/0261714 | A1 | 10/2012 | Taketani et al. | |
| 2012/0276703 | A1* | 11/2012 | Grivna | H01L 29/407 438/270 |
| 2012/0319199 | A1* | 12/2012 | Zeng | H01L 29/407 257/334 |
| 2013/0001680 | A1* | 1/2013 | Nakano | H01L 29/0623 257/330 |
| 2013/0306983 | A1* | 11/2013 | Nakano | H01L 29/0623 257/76 |
| 2014/0203356 | A1* | 7/2014 | Kagata | H01L 29/407 257/330 |
| 2015/0028354 | A1* | 1/2015 | Das | H01L 29/0873 257/77 |
| 2015/0263130 | A1* | 9/2015 | Aoi | H01L 29/0847 438/138 |
| 2016/0005857 | A1 | 1/2016 | Nakano | |
| 2017/0040413 | A1 | 2/2017 | Nakano | |

FOREIGN PATENT DOCUMENTS

| | | |
|---|---|---|
| EP | 2276066 A1 | 1/2011 |
| JP | 2000-174265 A | 6/2000 |
| JP | 2004-031471 A | 1/2004 |
| JP | 2008-117878 A | 5/2008 |
| JP | 2008-118011 A | 5/2008 |
| JP | 2008-227486 A | 9/2008 |
| JP | 2009-260253 A | 11/2009 |
| JP | 2010-258386 A | 11/2010 |
| JP | 2010-258387 A | 11/2010 |
| JP | 2012-146838 A | 8/2012 |
| JP | 2012-178536 A | 9/2012 |
| TW | 200701358 A | 5/2005 |
| TW | 200935556 A | 8/2009 |
| TW | 201125047 A | 7/2011 |
| TW | I404131 B | 8/2013 |
| WO | 2012/105613 A1 | 8/2012 |

OTHER PUBLICATIONS

Dec. 22, 2015 Office Action issued in Japanese Patent Application No. 2013-011918.
Aug. 5, 2015 Office Action issued in Taiwanese Patent Application No. 103102476.
Feb. 17, 2015 Office Action issued in Japanese Patent Application No. 2013-011918.
May 30, 2014 International Search Report issued in International Patent Application No. PCT/JP2014/000060.
May 30, 2014 Written Opinion issued in International Patent Application No. PCT/JP2014/000060.
Feb. 23, 2017 Office Action issued in Chinese Patent Application No. 201480004973.0.

* cited by examiner

METHOD OF MANUFACTURING SEMICONDUCTOR DEVICE

TECHNICAL FIELD

A technique disclosed in the present specification relates to a method of manufacturing a semiconductor device using a wide-gap semiconductor as a material.

BACKGROUND ART

A wide-gap semiconductor such as silicon carbide and gallium nitride is known as a material for realizing a semiconductor device capable of stably operating at a high temperature with low loss. However, a semiconductor device using a wide-gap semiconductor as the material has a problem in that it is difficult to introduce a dopant in high concentration by using ion implantation. Therefore, in Japanese Patent Application Publication No. 2008-118011 and Japanese Patent Application Publication No. 2010-258387, techniques for forming p-type base layers and n-type source layers by crystal growth are disclosed.

SUMMARY OF INVENTION

An object of the present specification is to provide a method of manufacturing a semiconductor device using a wide-gap semiconductor as a material.

A method of manufacturing a semiconductor device disclosed in the present specification includes: forming a first trench in a semiconductor layer, wherein the semiconductor layer has a surface including the first area and a second area, and the first trench is formed in the first area of the surface of the semiconductor layer; growing a crystal of a base layer of a first conductivity type on a surface of the semiconductor layer after forming the first trench; and growing a crystal of a source layer of a second conductivity type on a surface of the base layer. Materials of the semiconductor layer, the base layer, and the source layer are a wide-gap semiconductor. In the description, an expression that "the materials of the semiconductor layer, the base layer, and the source layer are a wide-gap semiconductor" includes configurations in which the same type of wide-gap semiconductor is used as the materials, and configurations in which different types of wide-gap semiconductors are used as the materials. The manufacturing method disclosed in the present specification has a characteristic in that before growing crystals of the base and source layers, the first trench is formed in the first area of the surface of the semiconductor layer. By forming the first trench, a useful semiconductor device using the wide-gap semiconductor as the material can be manufactured.

DESCRIPTION OF EMBODIMENTS

Figure 1:
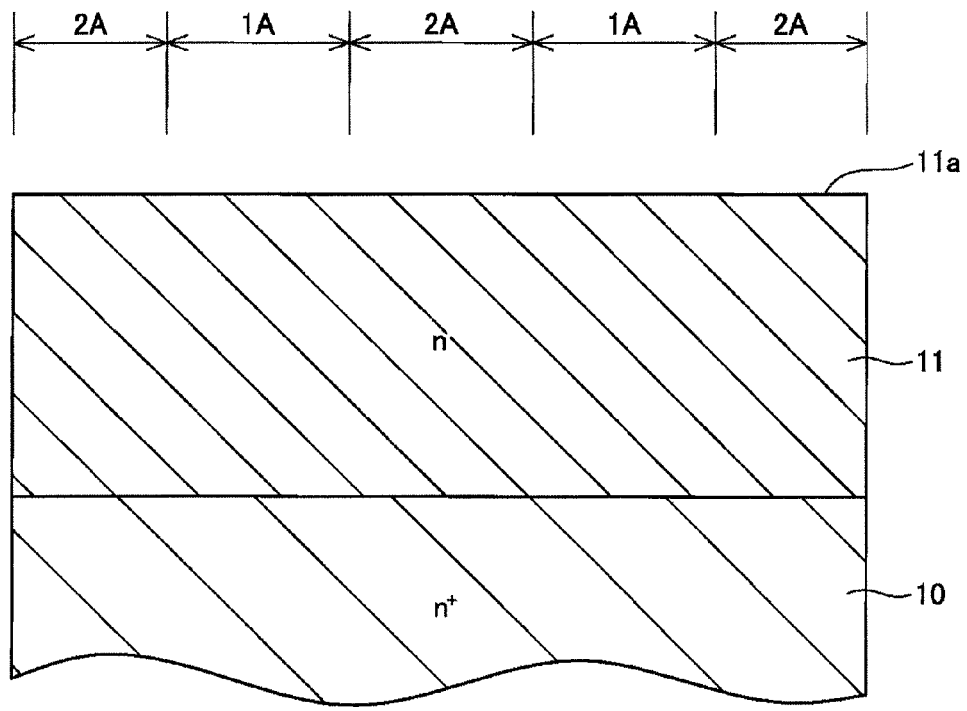
FIG. 1 schematically shows a cross-sectional view of a main part in one manufacturing process of a semiconductor device according to a first embodiment.

Some advantages of the technique disclosed in the present specification are summarized below. Matters described below have independently technical usefulness.

(Feature 1) One manufacturing method disclosed in the present specification is used for manufacturing a semiconductor device that uses a wide-gap semiconductor as a semiconductor material.

The wide-gap semiconductor is a semiconductor having a band gap larger than a band gap of silicon, and examples are silicon carbide, gallium nitride, and diamond. For a semiconductor device, MOSFET (Metal Oxide Semiconductor Field Effect Transistor) or IGBT (Insulated Gate Bipolar Transistor) is used, for example.

(Feature 2) A method of manufacturing a semiconductor device disclosed in the present specification includes a process of forming a first trench in a semiconductor layer that has a surface including the first area and a second area. The first trench is formed in the first area of the surface of the semiconductor layer. The method further includes a process of growing a crystal of a base layer of a first conductivity type on a surface of the semiconductor layer, and a process of growing a crystal of a source layer of a second conductivity type on a surface of the base layer. In the description, an expression of "growing a component on another component" includes configurations in which the component is formed directly on the other component, and also configurations in which the component is formed above the other component with yet another component intervened in between. The same interpretation applies to an expression of "leaving a component existing on another component", "forming a component on another component", and "a component existing on another component". Other layer may be formed before growing the crystal of the base layer, and other layer may be formed between the base layer and the source layer. The surface of the semiconductor layer may have other area, in addition to the first area and the second area. For example, the surface of the semiconductor layer may have the first area and the second area at positions corresponding to an element region of the semiconductor device, and have other areas at positions corresponding to a termination region of the semiconductor layer. The base layer is also referred to as a body layer. The source layer is also referred to as an emitter layer.

(Feature 3) One example of the method of manufacturing a semiconductor device disclosed in the present specification may further include a process of forming a second trench to expose the semiconductor layer by penetrating at least a part of the source and base layers that are existing on the second area of the surface of the semiconductor layer, and a process of forming an insulated trench gate in the second trench. According to this manufacturing method, because the semiconductor device comes to have a configuration in which the deep base layer is arranged around the insulated trench gate, a high-voltage semiconductor device can be obtained.

(Feature 4) The manufacturing method according to the feature 3 may further include a process of forming a mask layer on the surface of the source layer before forming the second trench, and a process of selectively leaving the mask layer existing on the first area of the surface of semiconductor layer by etching a predetermined thickness from a surface of the mask layer. In this case, in the process of forming the second trench, the second trench is formed by using the mask layer as a mask. According to this manufacturing method, the mask layer can be selectively patterned by using a trench in which a configuration of the first trench is reflected. Therefore, according to this manufacturing method, because a photo mask for patterning the mask layer is not necessary, the semiconductor device can be manufactured at low cost.

(Feature 5) The manufacturing method according to the feature 3 or 4 may further include a process of exposing the base layer by etching at least a part of the source layer existing on the first area of the semiconductor layer, and a process of forming the source electrode that is in contact with the exposed base layer.

(Feature 6) One example of the method of manufacturing a semiconductor device disclosed in the present specification may further include a process of forming a third trench to expose the semiconductor layer by penetrating at least a part of the source and base layers that are existing on the first area of the surface of the semiconductor layer, and a process of forming an insulated trench gate in the third trench.

(Feature 7) In the manufacturing method according to the feature 6, in the process of forming the third trench, the third trench may be formed so as to leave the source layer extending along a depth direction existing on a side surface of the third trench. According to this manufacturing method, because the source layer is formed up to a deep position along a side surface of the insulated trench gate, influence of a variation in an etching amount of the trench gate electrode at the time of forming the insulated trench gate can be suppressed.

(Feature 8) In the manufacturing method according to the feature 6, in the process of forming the third trench, the third trench may be formed so as not to leave the source layer extending in a depth direction existing on a side surface of the third trench. According to this manufacturing method, because the base layer is formed up to a deep position along a side surface of the insulated trench gate, latch up can be suppressed.

(Feature 9) The manufacturing method according to any one of the features 6 to 8 may further include a process of exposing the base layer by etching at least a part of the source layer existing on the second area of the surface of the semiconductor layer, and a process of forming the source electrode that is in contact with the exposed base layer.

(Feature 10) One example of the method of manufacturing a semiconductor device disclosed in the present specification may further include a process of selectively leaving the source and base layers existing on the first area of the surface of the semiconductor layer by etching a predetermined thickness from a surface of the source layer, and a process of forming an insulated planar gate facing the base layer left existing on the first area of the semiconductor layer. According to this manufacturing method, a semiconductor device of a planar type can be manufactured.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as manufacturing methods for the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Hereinafter, a method of manufacturing a MOSFET is described with reference to the drawings. Common reference symbols are attached to configuration elements that are common to each embodiment, and descriptions of the common configuration elements are omitted where appropriate.

First Embodiment

According to a method of manufacturing a MOSFET in a first embodiment, first, as shown in FIG. 1, a semiconductor layer formed by stacking an $n^+$-type substrate 10 and an n-type drift layer 11 is prepared. The substrate 10 is a silicon carbide substrate having a plane orientation of (0001). The drift layer 11 of silicon carbide is formed by growing a crystal from the substrate 11 by using an epitaxial growth technique. A surface 11a of the drift layer 11 includes a first area 1A and a second area 2A.

Figure 2:
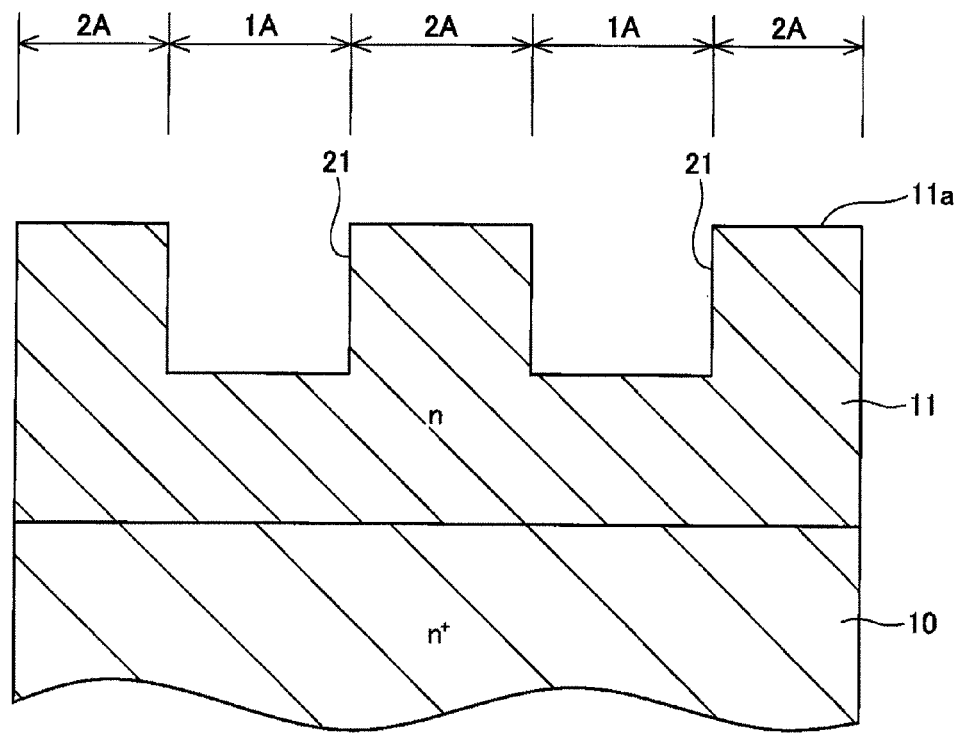
FIG. 2 schematically shows a cross-sectional view of a main part in one manufacturing process of the semiconductor device according to the first embodiment.

As shown in FIG. 2, a first trench 21 is formed in the first area 1A of the surface 11a of the drift layer 11 by using an etching technique. The first trench 21 has a predetermined depth in the surface layer of the drift layer 11.

Figure 3:
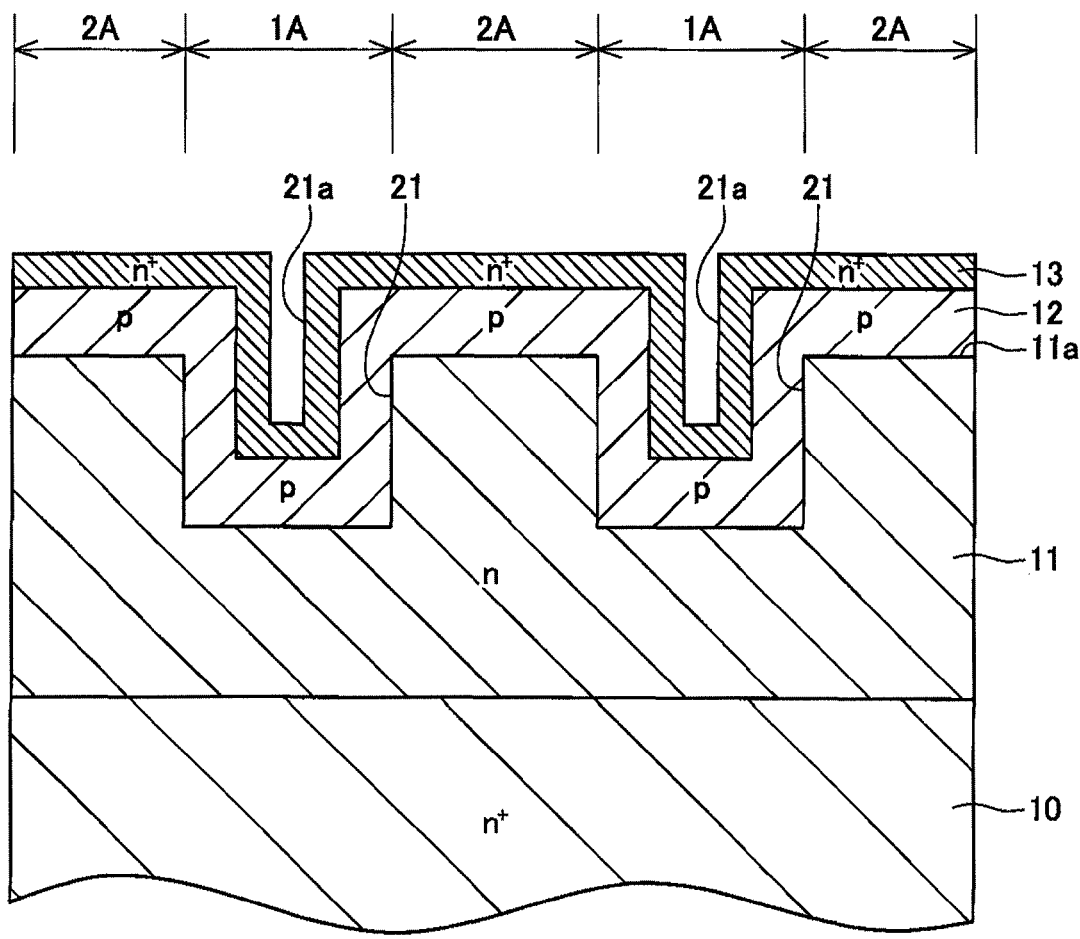
FIG. 3 schematically shows a cross-sectional view of a main part in one manufacturing process of the semiconductor device according to the first embodiment.

Next, as shown in FIG. 3, crystals of a p-type base layer 12 of silicon carbide and an $n^+$-type source layer 13 of silicon carbide are grown on the surface 11a of the drift layer 11 by using the epitaxial growth technique. Before epitaxially growing the base layer 12, an n-type current dispersion layer having a higher impurity concentration than that of the drift layer 11 may be epitaxially grown between the drift layer 11 and the base layer 12. The base layer 12 and the source layer 13 cover both the first area 1A and the second area 2A of the surface 11a of the drift layer 11. Particularly, the base layer 12 and the source layer 13 are formed in the first trench 21, in the first area 1A of the surface 11a of the drift layer 11, and have portions extending along a depth direction depending on a configuration of the first trench 21. A trench 21a in which the configuration of the first trench 21 is reflected is formed in an area corresponding to the first area 1A of the drift layer 11.

Figure 4:
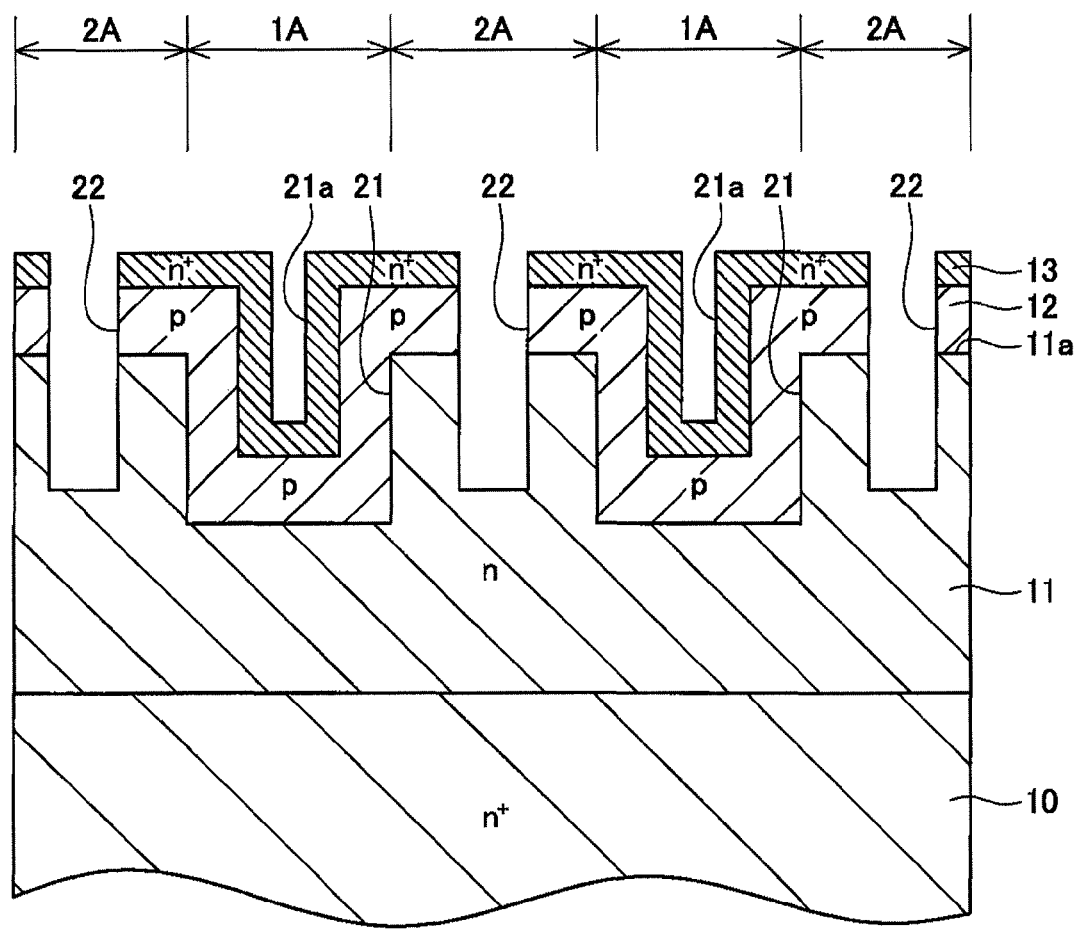
FIG. 4 schematically shows a cross-sectional view of a main part in one manufacturing process of the semiconductor device according to the first embodiment.

Next, as shown in FIG. 4, by using the etching technique, a second trench 22 that reaches the drift layer 11 is formed by penetrating a part of the base layer 12 and the source layer 13 existing on the second area 2A of the surface 11a of the drift layer 11. The second trench 22 is formed shallower than the first trench 21. Therefore, a bottom surface of the second trench 22 is shallower than a position of the base layer 12 that is formed in the first trench 21.

Figure 5:
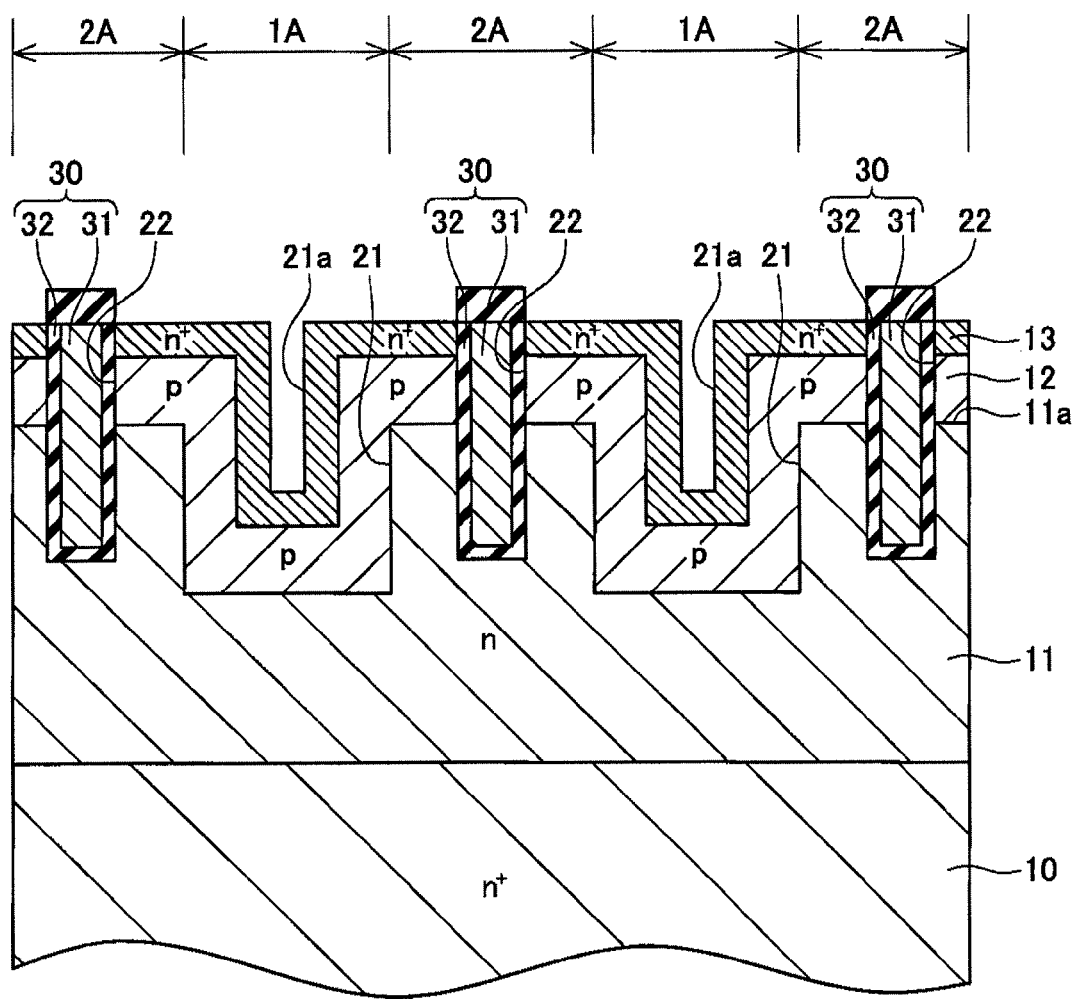
FIG. 5 schematically shows a cross-sectional view of a main part in one manufacturing process of the semiconductor device according to the first embodiment.

Next, as shown in FIG. 5, an insulated trench gate 30 is formed in the second trench 22. Specifically, after forming a gate insulated film 32 of silicon oxide on an inner wall of the second trench 22 by using a thermal oxidation technique, a trench gate electrode 31 of polysilicon is filled in the second trench 22 by using a vapor deposition technique.

Figure 6:
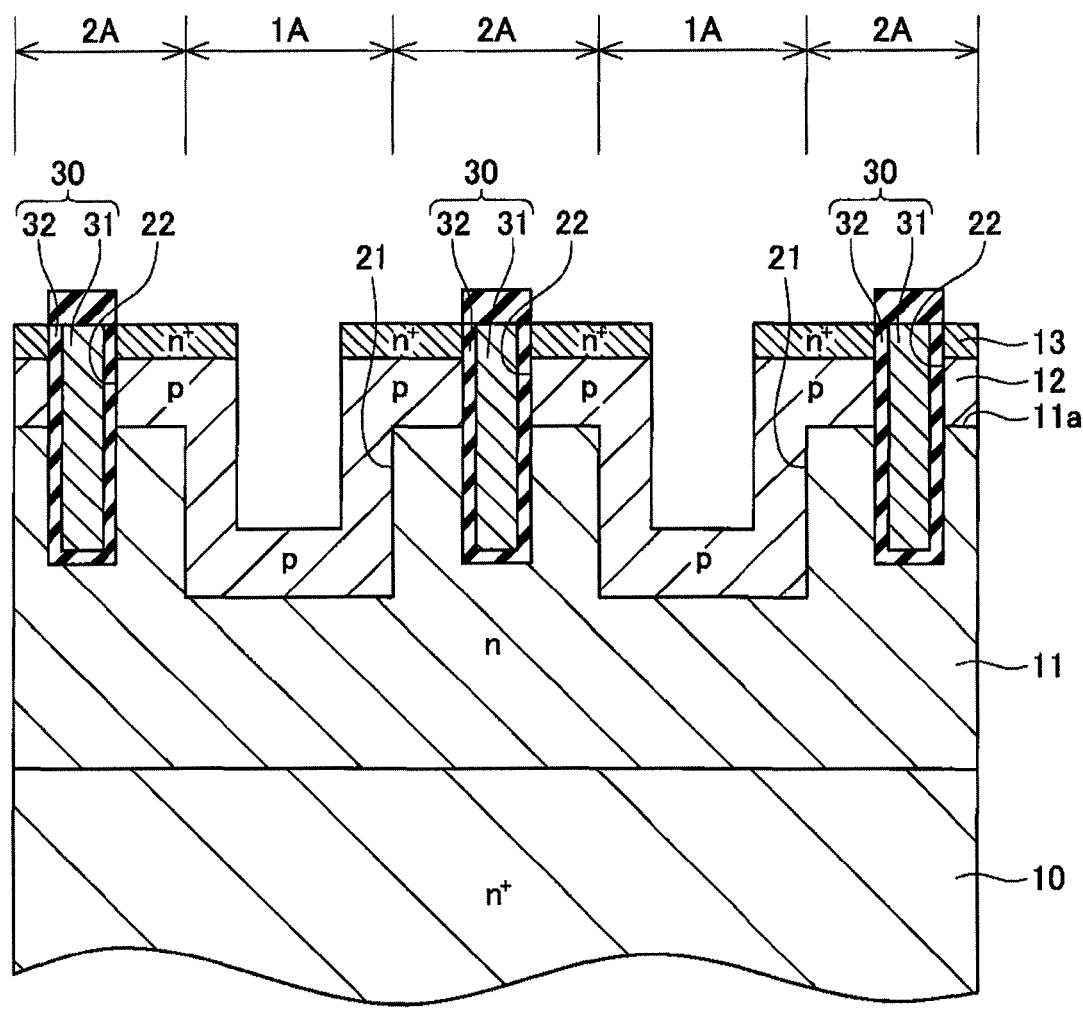
FIG. 6 schematically shows a cross-sectional view of a main part in one manufacturing process of the semiconductor device according to the first embodiment.

Next, as shown in FIG. 6, by using the etching technique, a part of the source layer 13 existing on the first area 1A of the surface 11a of the drift layer 11 is removed, and the base layer 12 is exposed. In the present example, of the source layer 13 existing on the first area 1A of the surface 11a of the drift layer 11, all portions extending along the depth direction are removed.

Figure 7:
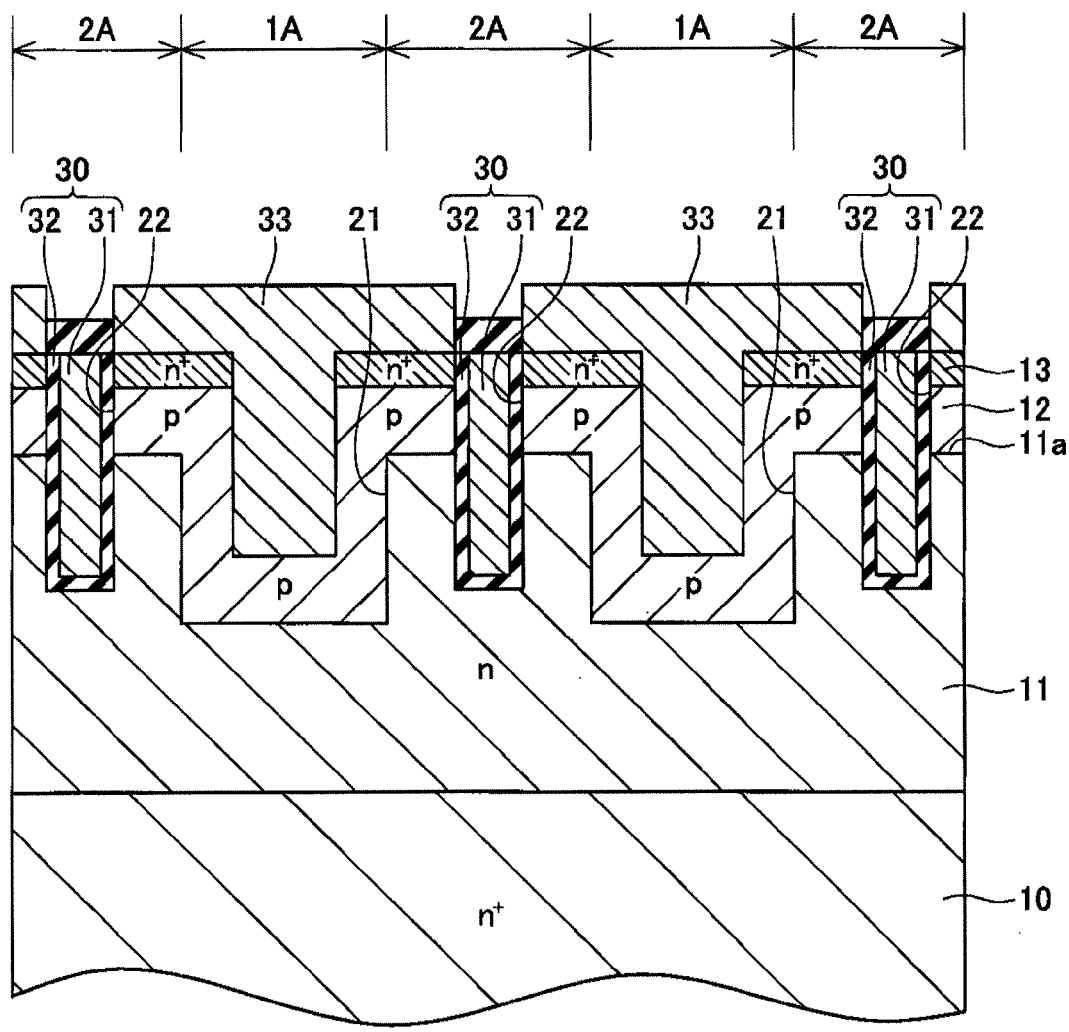
FIG. 7 schematically shows a cross-sectional view of a main part in one manufacturing process of the semiconductor device according to the first embodiment.

Next, as shown in FIG. 7, a source electrode 33 that is in ohmic contact with the source layer 13 and the base layer 12 is formed by using the vapor deposition technique. In one example, a material of the source electrode 33 is nickel or nickel silicide.

Last, a drain electrode (not shown) is formed on a rear surface of the substrate 10, and the MOSFET is completed. In this way, according to the above manufacturing method, the MOSFET that uses silicon carbide as a material can be manufactured without heavily relying on an ion implantation technique. Further, the MOSFET manufactured by the above manufacturing method has a characteristic in that the MOSFET has a configuration that the drift layer 11 and the base layer 12 are alternately arranged along a lateral direction at a surface layer part of the drift layer 11. Therefore, when the MOSFET is off, the surface part of the drift layer 11 is satisfactorily depleted by a depletion layer extended to a lateral direction from the base layer 12, and a dielectric strength improves. Particularly, because the base layer 12 is provided deeper than the insulated trench gate 30, field concentration at a bottom part of the insulated trench gate 30 is mitigated, and breakdown of a gate insulated film 32 of the insulated trench gate 30 can be suppressed.

Figure 8:
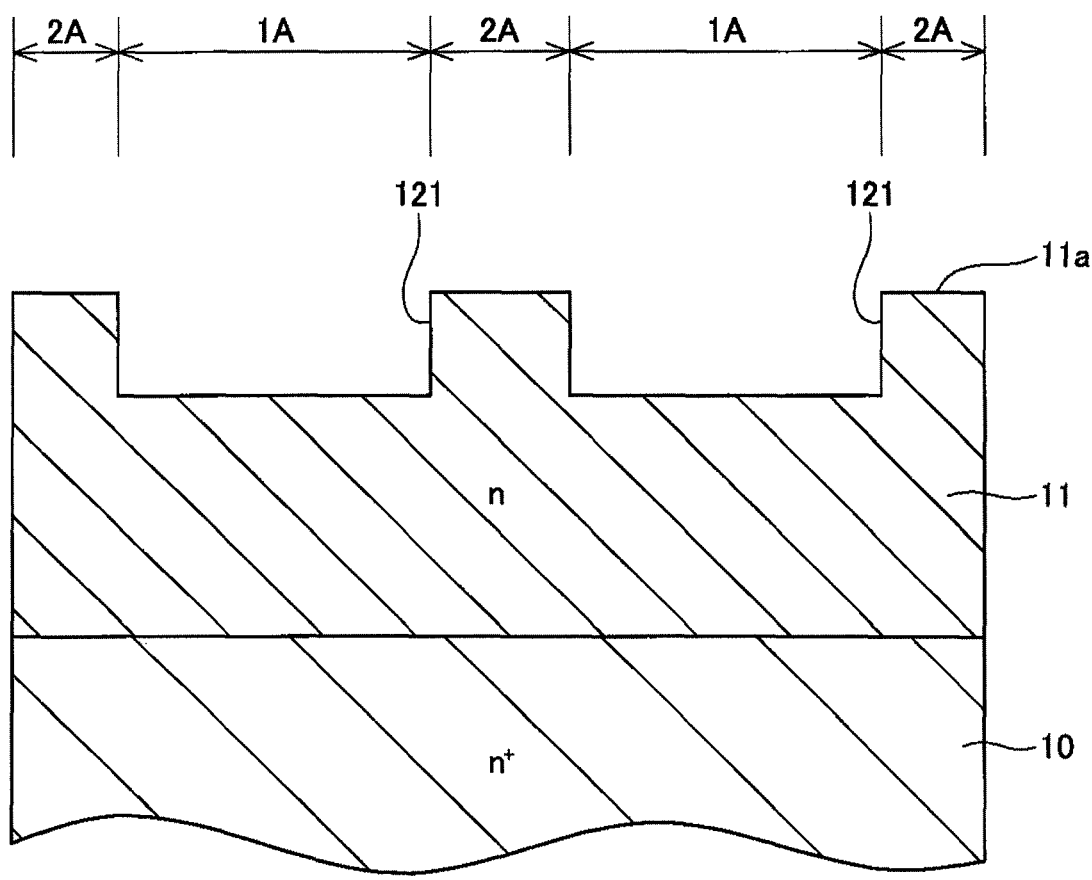
FIG. 8 schematically shows a cross-sectional view of a main part in one manufacturing process of a semiconductor device according to a modification of the first embodiment.

(Modification) A modification of the method of manufacturing a MOSFET according to the first embodiment is described next. As shown in FIG. 8, after preparing a semiconductor layer formed by stacking the $n^+$-type substrate 10 and the n-type drift layer 11, a first trench 121 is formed in the first area 1A of the surface 11a of the drift layer 11. The first trench 121 has a predetermined depth in a surface layer part of the drift layer 11.

Figure 9:
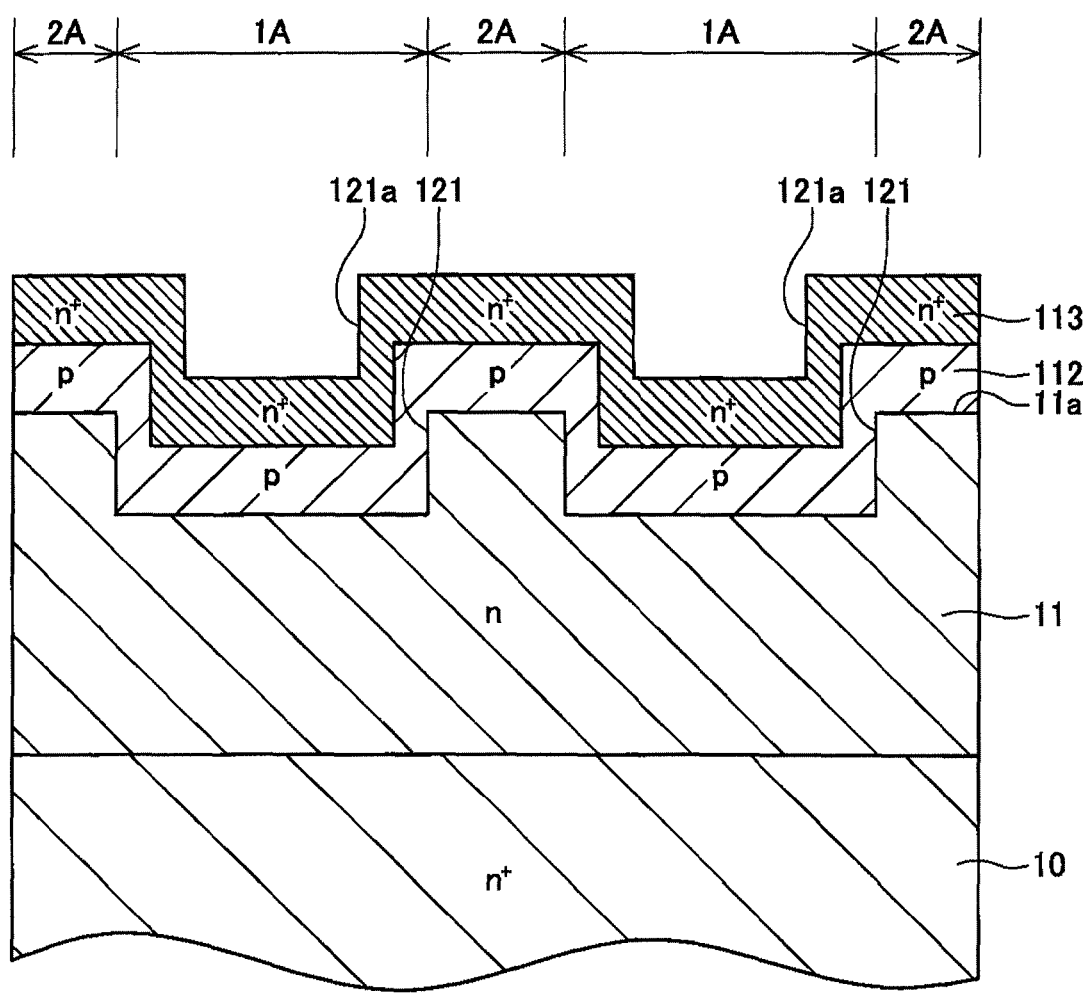
FIG. 9 schematically shows a cross-sectional view of a main part in one manufacturing process of the semiconductor device according to the modification of the first embodiment.

Next, as shown in FIG. 9, crystals of a p-type base layer 112 of silicon carbide and an $n^+$-type source layer 113 of silicon carbide are grown on the surface 11a of the drift layer 11 by using the epitaxial growth technique. Before epitaxially growing the base layer 112, an n-type current dispersion layer having a higher impurity concentration than that of the drift layer 11 may be epitaxially grown between the drift layer 11 and the base layer 112. The base layer 112 and the source layer 113 cover both the first area 1A and the second area 2A of the surface 11a of the drift layer 11. Particularly, the base layer 112 and the source layer 113 are formed in the first trench 121, in the first area 1A of the surface 11a of the drift layer 11, and have portions extending along a depth direction depending on a configuration of the first trench 121. A trench 121a in which the configuration of the first trench 121 is reflected is formed in an area corresponding to the first area 1A of the surface 11a of the drift layer 11.

Figure 10:
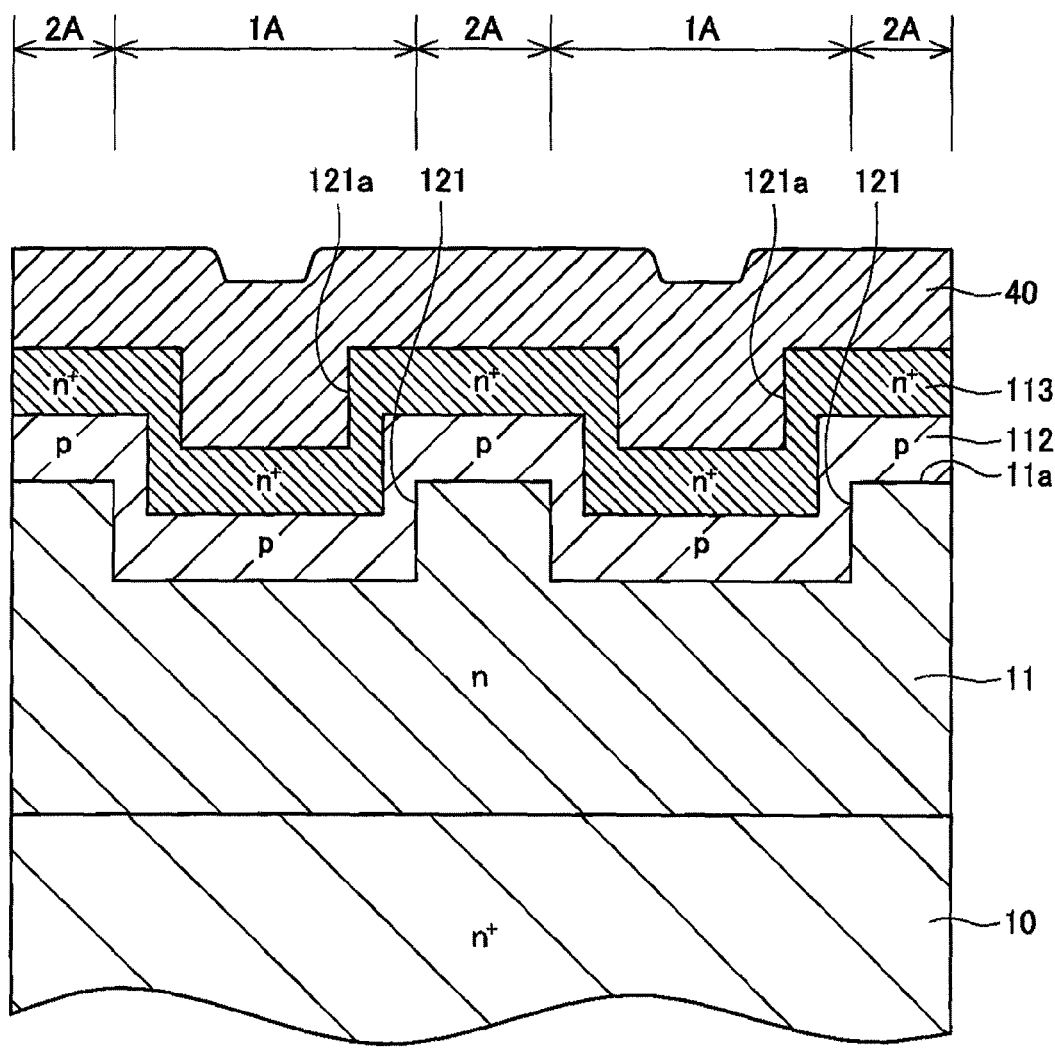
FIG. 10 schematically shows a cross-sectional view of a main part in one manufacturing process of the semiconductor device according to the modification of the first embodiment.

Next, as shown in FIG. 10, a mask layer 40 is formed on a surface of the source layer 113, by using a CVD technique. The mask layer 40 is filled in the trench 121a in which the configuration of the first trench 121 is reflected. In one example, a material of the mask layer 40 is silicon oxide.

Figure 11:
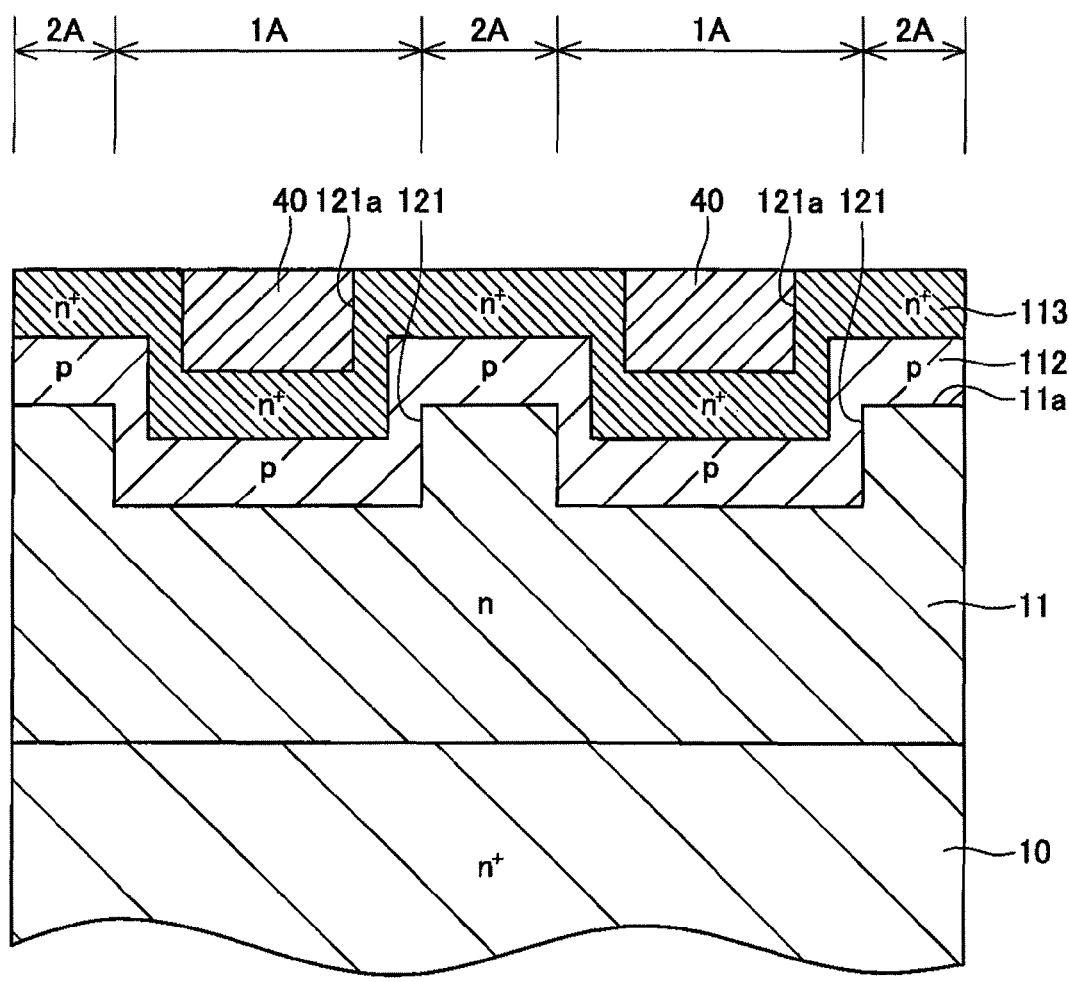
FIG. 11 schematically shows a cross-sectional view of a main part in one manufacturing process of the semiconductor device according to the modification of the first embodiment.

Next, as shown in FIG. 11, by using the etching technique, a top portion of the mask layer 40 is removed from the surface by a predetermined thickness. Specifically, by using a dry etching technique, the mask layer 40 is removed until the source layer 113 existing on the second area 2A of the surface 11a of the drift layer 11 is exposed. In this way, by forming the first trench 121 in the drift layer 11, the mask layer 40 can be selectively left in the trench 121a in which the configuration of the first trench 121 is reflected.

Figure 12:
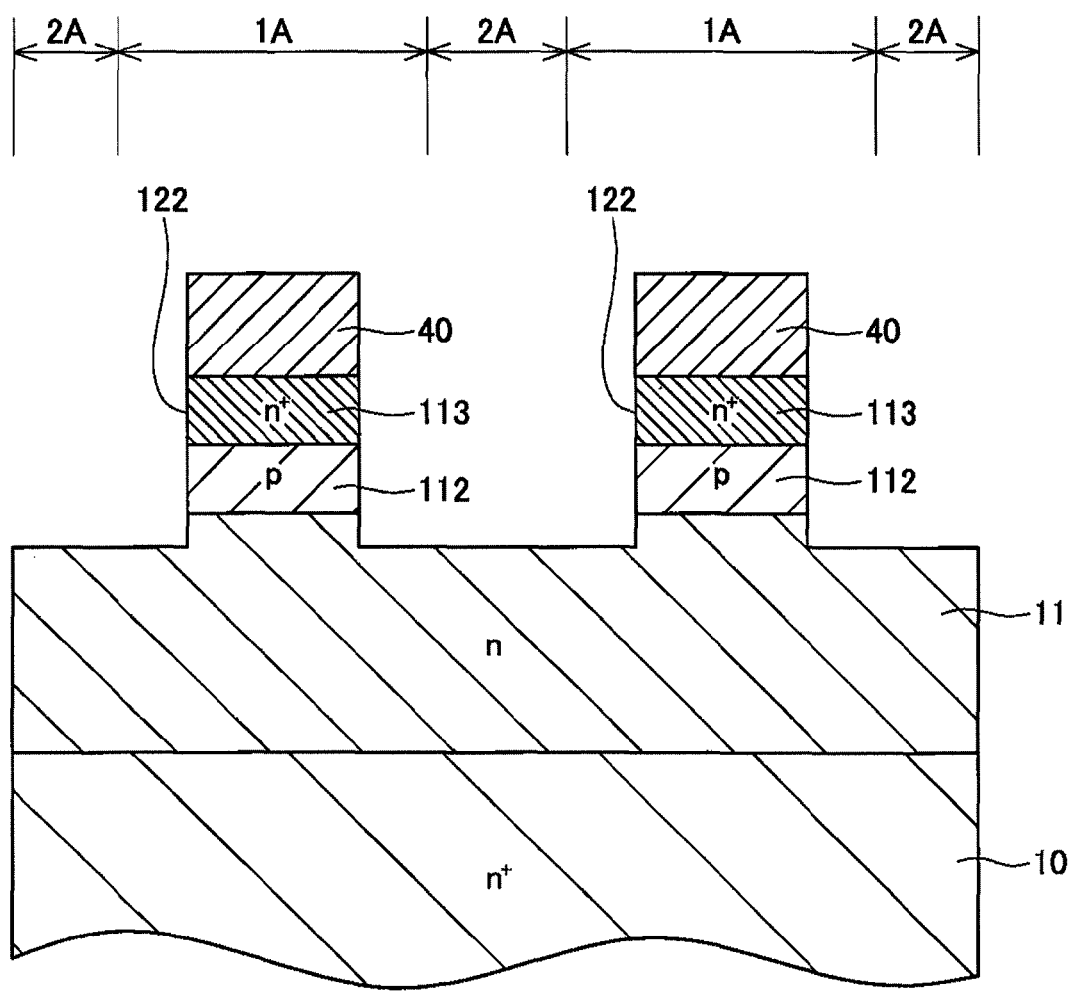
FIG. 12 schematically shows a cross-sectional view of a main part in one manufacturing process of the semiconductor device according to the modification of the first embodiment.

Next, as shown in FIG. 12, a second trench 122 is formed by using the mask layer 40 as a mask, and the drift layer 11 is exposed. After forming the second trench 122, the mask layer 40 is removed.

Figure 13:
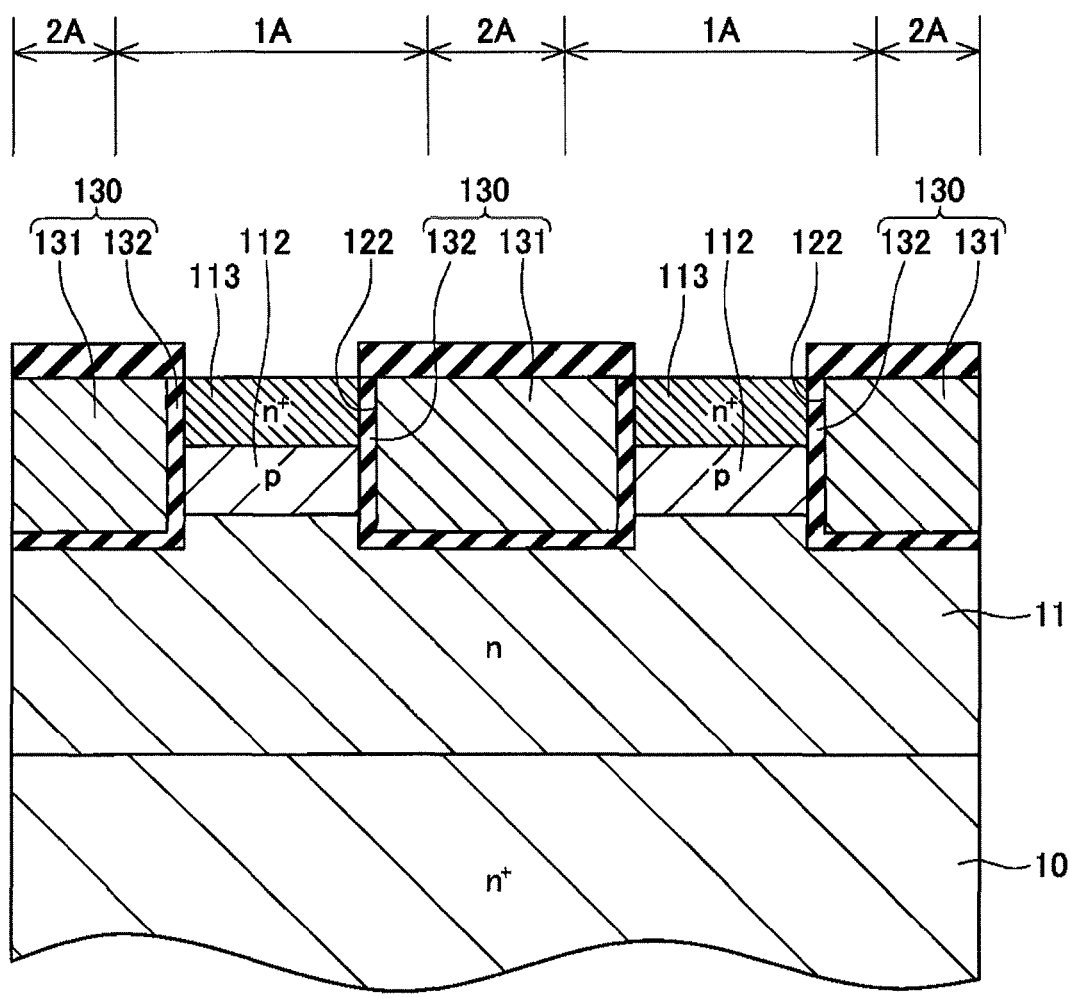
FIG. 13 schematically shows a cross-sectional view of a main part in one manufacturing process of the semiconductor device according to the modification of the first embodiment.

Next, as shown in FIG. 13, an insulated trench gate 130 is formed in the second trench 122. Specifically, after a gate insulated film 132 of silicon oxide is formed on an inner wall of the second trench 122 by using the thermal oxidation technique or the CVD technique, a trench gate electrode 131 of polysilicon is filled in the second trench 122 by using the vapor deposition technique.

Figure 14:
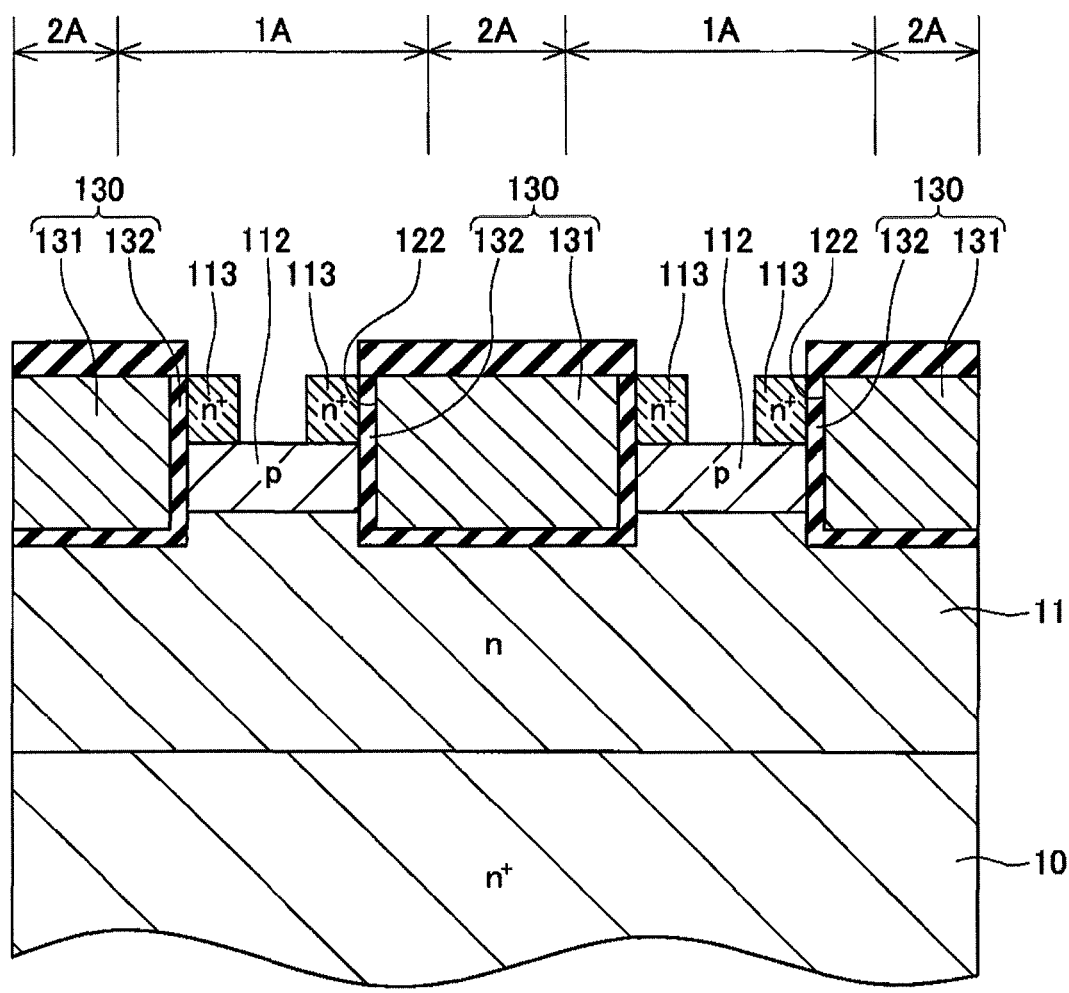
FIG. 14 schematically shows a cross-sectional view of a main part in one manufacturing process of the semiconductor device according to the modification of the first embodiment.

Next, as shown in FIG. 14, by using the etching technique, a part of the source layer 113 existing on the first area 1A of the surface of the drift layer 11 is etched, and the base layer 112 is exposed.

Figure 15:
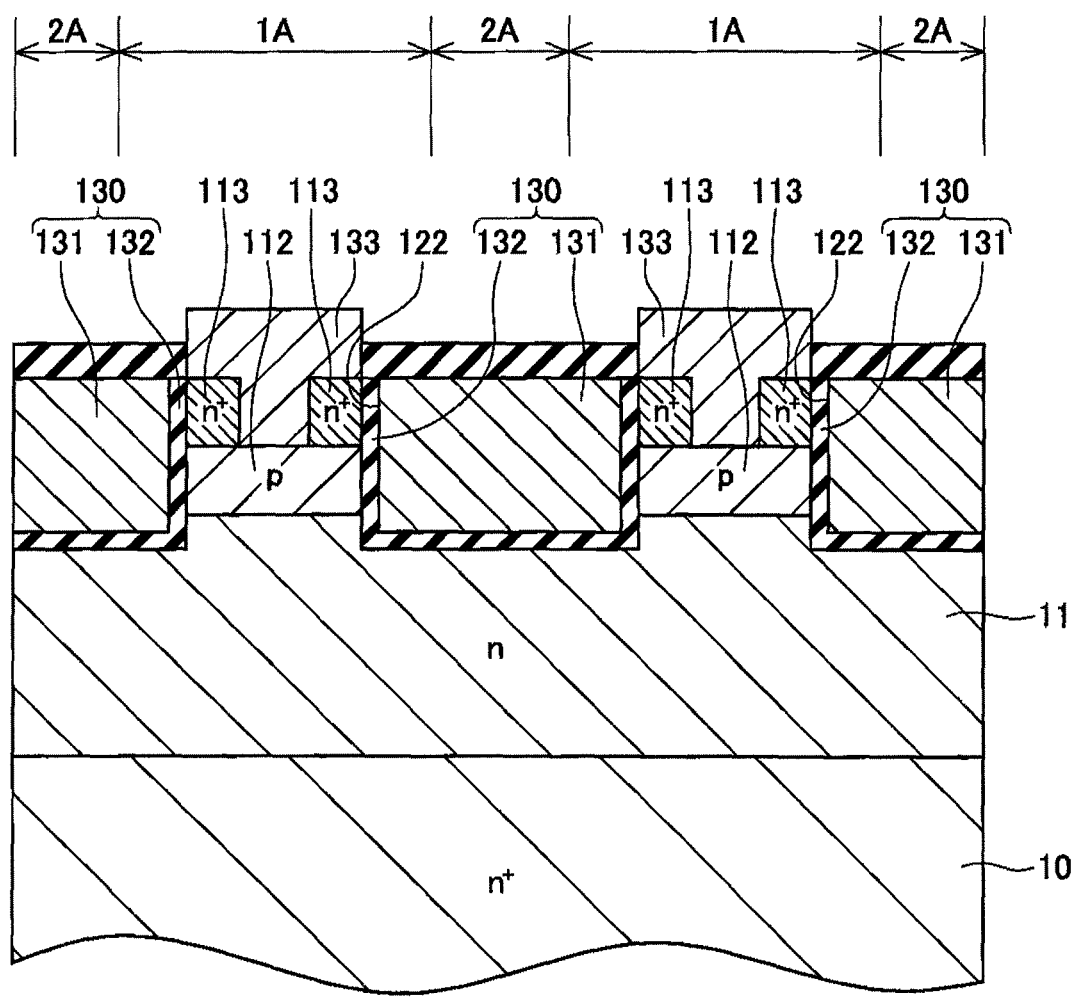
FIG. 15 schematically shows a cross-sectional view of a main part in one manufacturing process of the semiconductor device according to the modification of the first embodiment.

Next, as shown in FIG. 15, by using the vapor deposition technique, a source electrode 133 that is in ohmic contact with the source layer 113 and the base layer 112 is formed. In one example, a material of the source electrode 133 is nickel or nickel silicide.

Last, a drain electrode (not shown) is formed on a rear surface of the substrate 10, and the MOSFET is completed. According to the manufacturing method in the above modification, a MOSFET that uses silicon carbide as a material can be manufactured without positively using the ion implantation technique. According to the manufacturing method in the above modification, the mask layer 40 can be selectively patterned by using the trench 121a (see FIG. 11) in which the configuration of the first trench 121 is reflected. Therefore, in the present manufacturing method, because a photo mask for patterning the mask layer 40 is not necessary, the MOSFET can be manufactured at low cost.

Second Embodiment

A method of manufacturing a MOSFET in a second embodiment is the same as the method of manufacturing a MOSFET in the first embodiment, up to the formation of the base layer 12 and the source layer 13 on the surface 11a of the drift layer 11 (see FIGS. 1 to 3).

Figure 16:
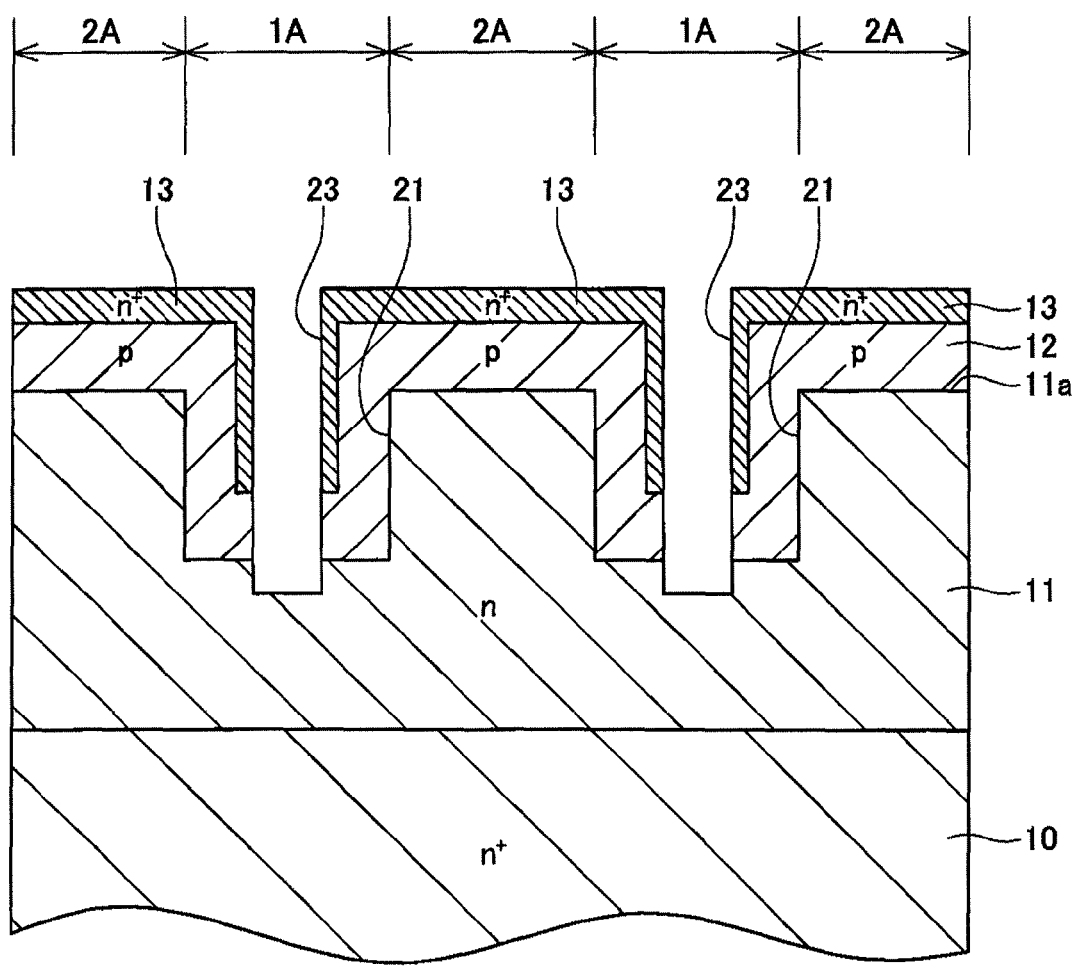
FIG. 16 schematically shows a cross-sectional view of a main part in one manufacturing process of a semiconductor device according to a second embodiment.

Next, as shown in FIG. 16, by using the etching technique, a third trench 23 that reaches the drift layer 11 is formed by penetrating a part of the base layer 12 and the source layer 13 present in the first area 1A of the surface 11a of the drift layer 11. The third trench 23 is formed so that the source layer 13 extending along a depth direction is left existing on a side surface of the third trench 23. That is, the third trench 23 is formed so that a part of a bottom surface of the source layer 13 formed in the first trench 21 is left existing.

Figure 17:
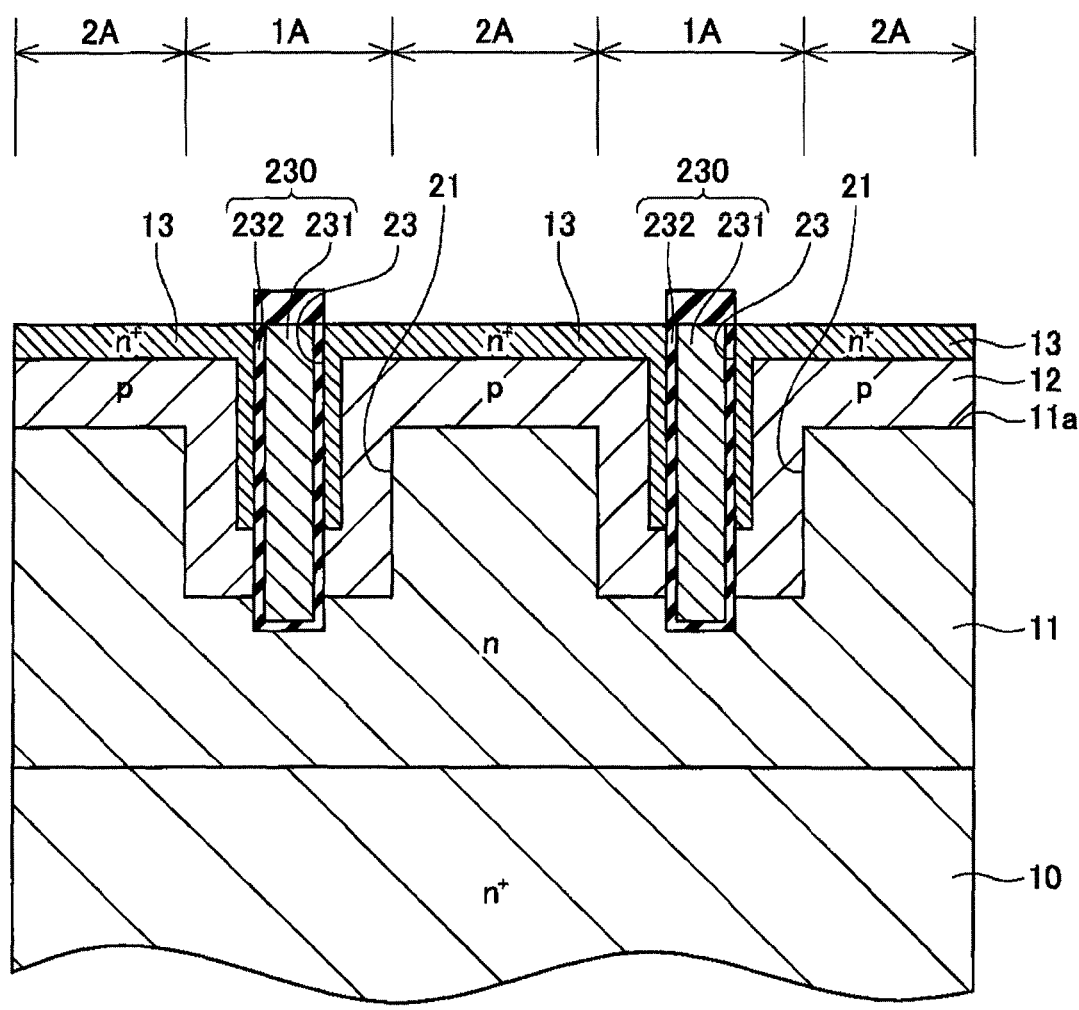
FIG. 17 schematically shows a cross-sectional view of a main part in one manufacturing process of the semiconductor device according to the second embodiment.

Next, as shown in FIG. 17, an insulated trench gate 230 is formed in the third trench 23. Specifically, after a gate insulated film 232 of silicon oxide is formed on an inner wall of the third trench 23 by using the thermal oxidation technique, a trench gate electrode 231 of polysilicon is filled in the third trench 23 by using the vapor deposition technique.

Figure 18:
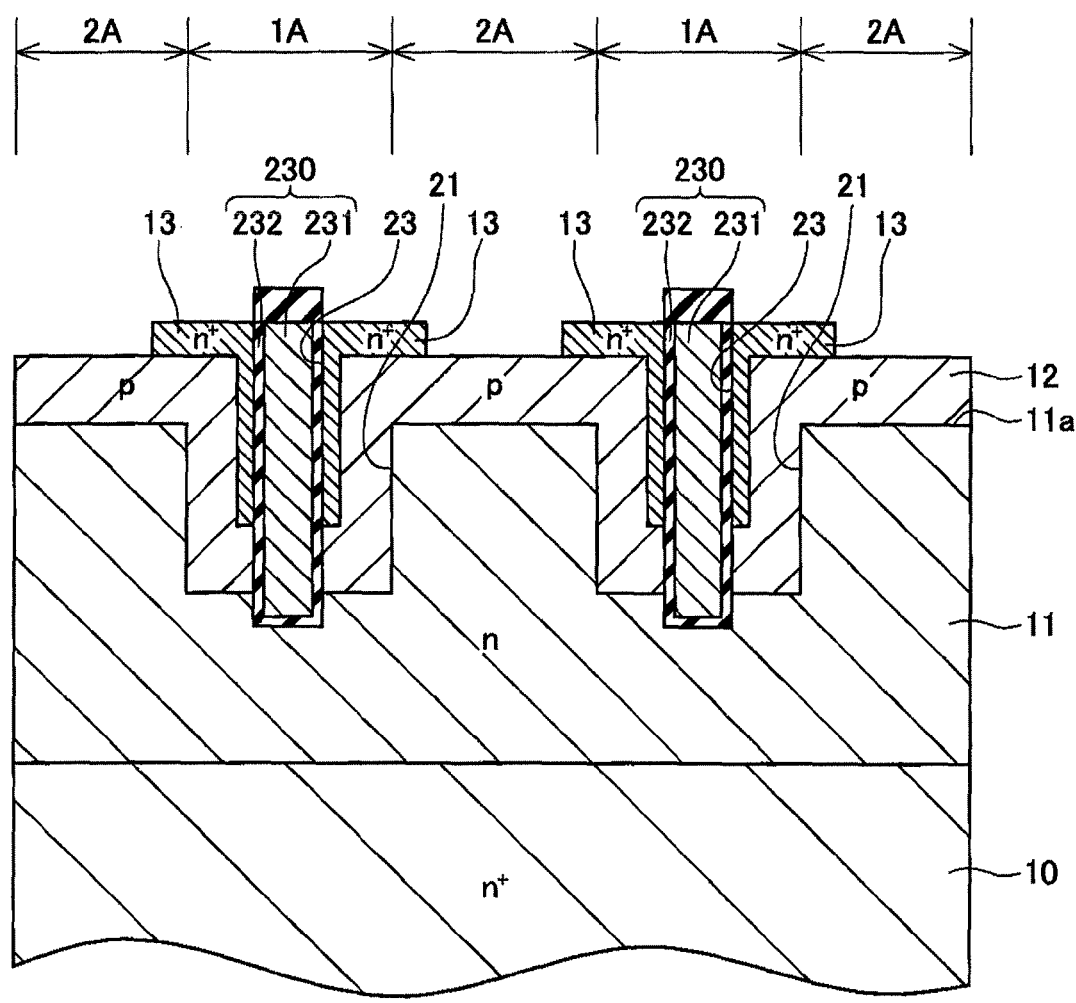
FIG. 18 schematically shows a cross-sectional view of a main part in one manufacturing process of a semiconductor device according to the second embodiment.

Next, as shown in FIG. 18, by using the etching technique, a part of the source layer 13 existing on the second area 2A of the surface 11a of the drift layer 11 is etched, and the base layer 12 is exposed.

Figure 19:
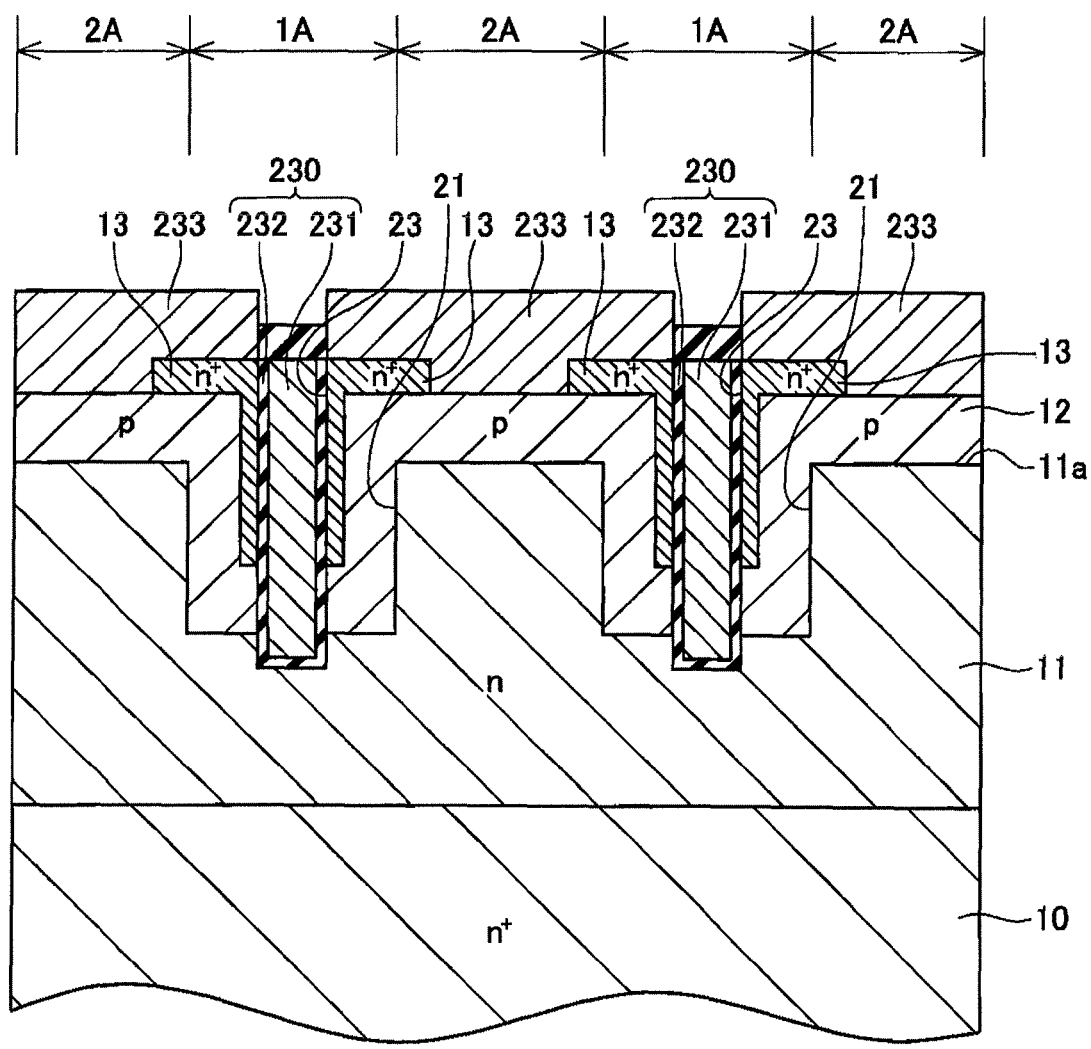
FIG. 19 schematically shows a cross-sectional view of a main part in one manufacturing process of the semiconductor device according to the second embodiment.

Next, as shown in FIG. 19, by using the vapor deposition technique, a source electrode 233 that is in ohmic contact with the source layer 13 and the base layer 12 is formed. In one example, a material of the source electrode 233 is nickel or nickel silicide.

Figure 20:
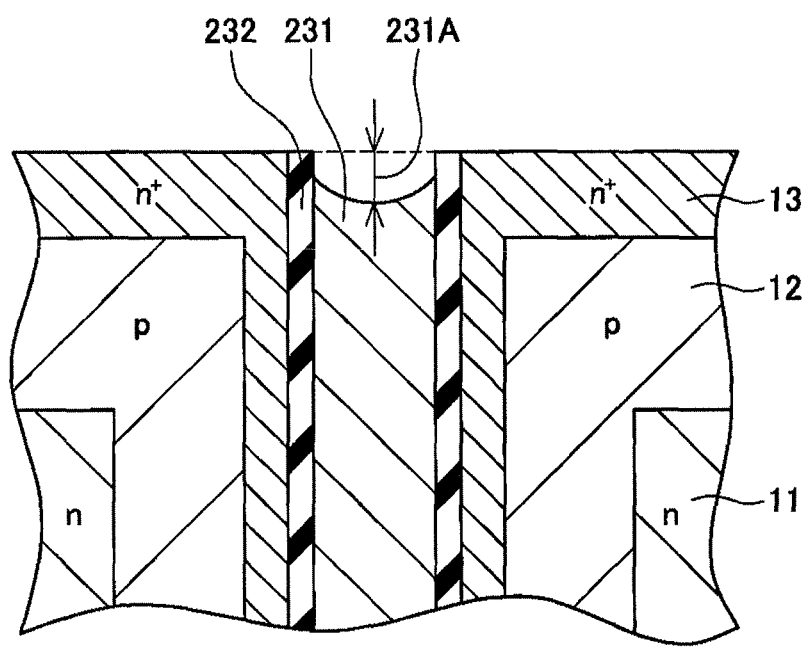
FIG. 20 shows a view for explaining an advantage of easily manufacturing a trench gate in the semiconductor device according to the second embodiment.

Last, a drain electrode (not shown) is formed on the rear surface of the substrate 10, and the MOSFET is completed. According to the above manufacturing method, a MOSFET that uses silicon carbide as a material can be manufactured without positively using the ion implantation technique. According to the MOSFET manufactured by the above manufacturing method, the source layer 13 is present up to a deep position of the side surface of the third trench 23. As shown in FIG. 20, to selectively fill the trench gate electrode 231 in the third trench 23, the trench gate electrode 231 deposited at other portion than the third trench 23 needs to be etched. To etch the trench gate electrode 231 of polysilicon, for example, a chlorine gas is used. However, because an etching rate of polysilicon is high, a variation in a depth 231A to which the trench gate electrode 231 in the third trench 23 is etched is large. According to the MOSFET manufactured by the above manufacturing method, because the source layer 13 is present up to a deep position of the side surface of the third trench 23, influence of a variation in the depth 231A to which the trench gate electrode 231 in the third trench 23 is etched can be suppressed.

Figure 21:
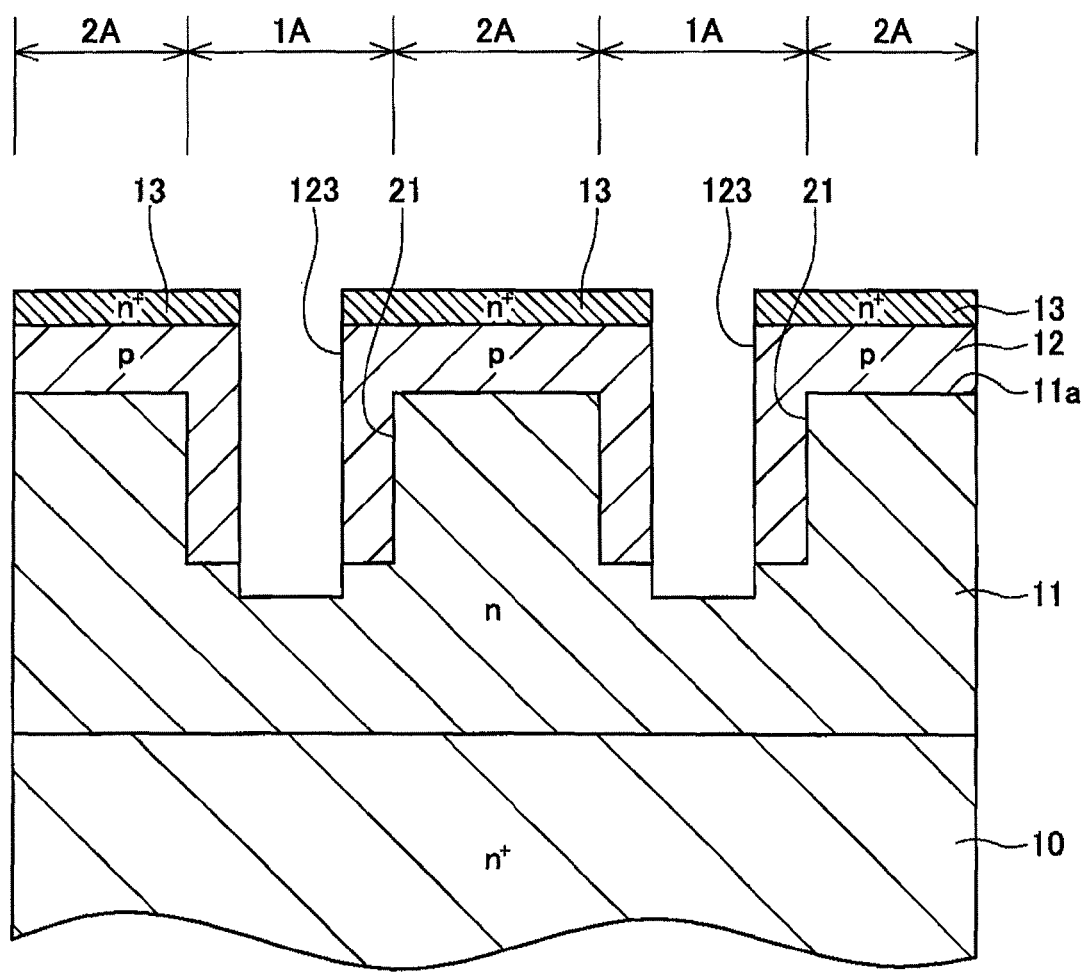
FIG. 21 schematically shows a cross-sectional view of a main part in one manufacturing process of a semiconductor device according to a modification of the second embodiment.

(Modification) A modification of the method of manufacturing a MOSFET according to the second embodiment is described next. As shown in FIG. 21, by using the etching technique, a third trench 123 that reaches the drift layer 11 is formed by penetrating a part of the base layer 12 and the source layer 13 present in the first area 1A of the surface 11a of the drift layer 11. The third trench 123 is formed so that the source layer 13 extending along a depth direction is not left existing on a side surface of the third trench 123. That is, the third trench 123 is formed so that the bottom surface of the source layer 13 formed in the first trench 21 does not remain.

Figure 22:
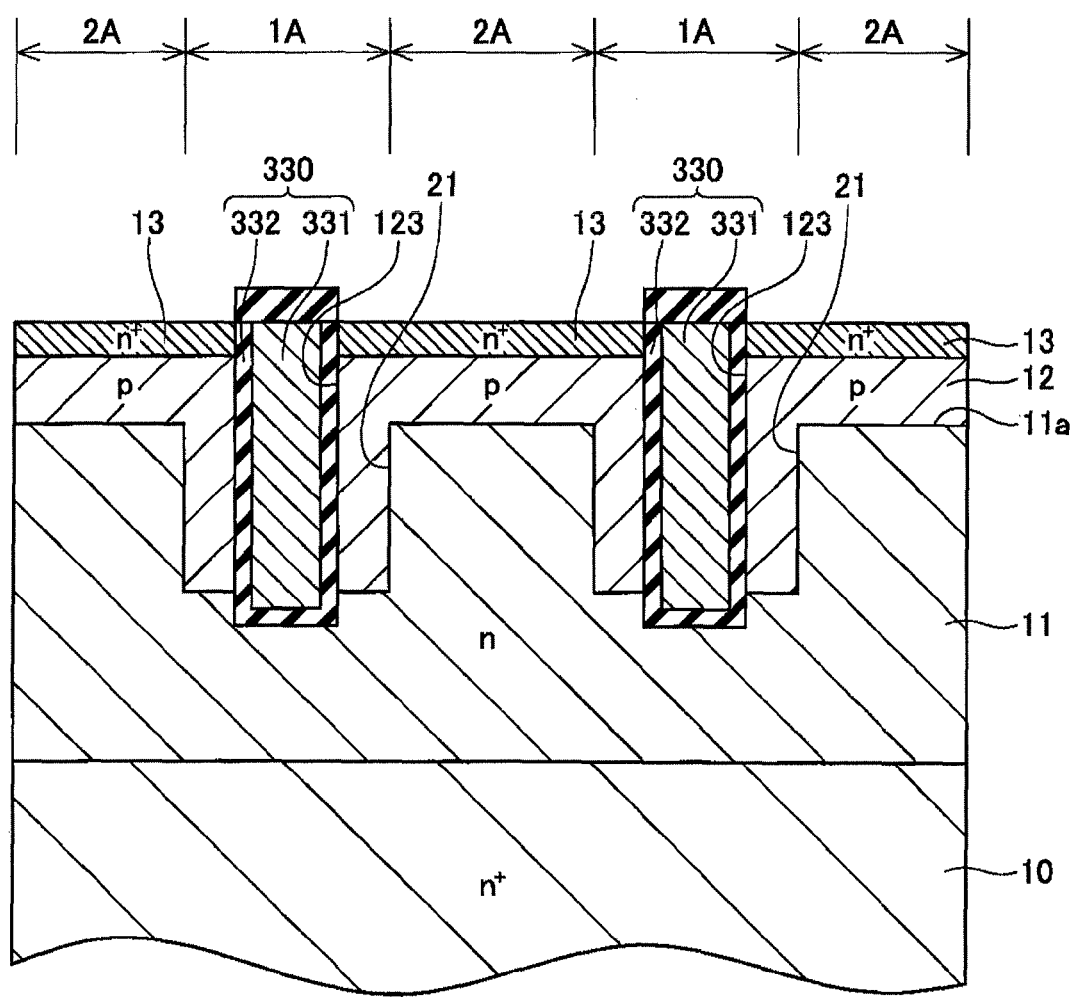
FIG. 22 schematically shows a cross-sectional view of a main part in one manufacturing process of the semiconductor device according to the modification of the second embodiment.

Next, as shown in FIG. 22, an insulated trench gate 330 is formed in the third trench 123. Specifically, after a gate insulated film 332 of silicon oxide is formed on an inner wall of the third trench 123 by using the thermal oxidation technique, a trench gate electrode 331 of polysilicon is filled in the third trench 123 by using the vapor deposition technique.

Figure 23:
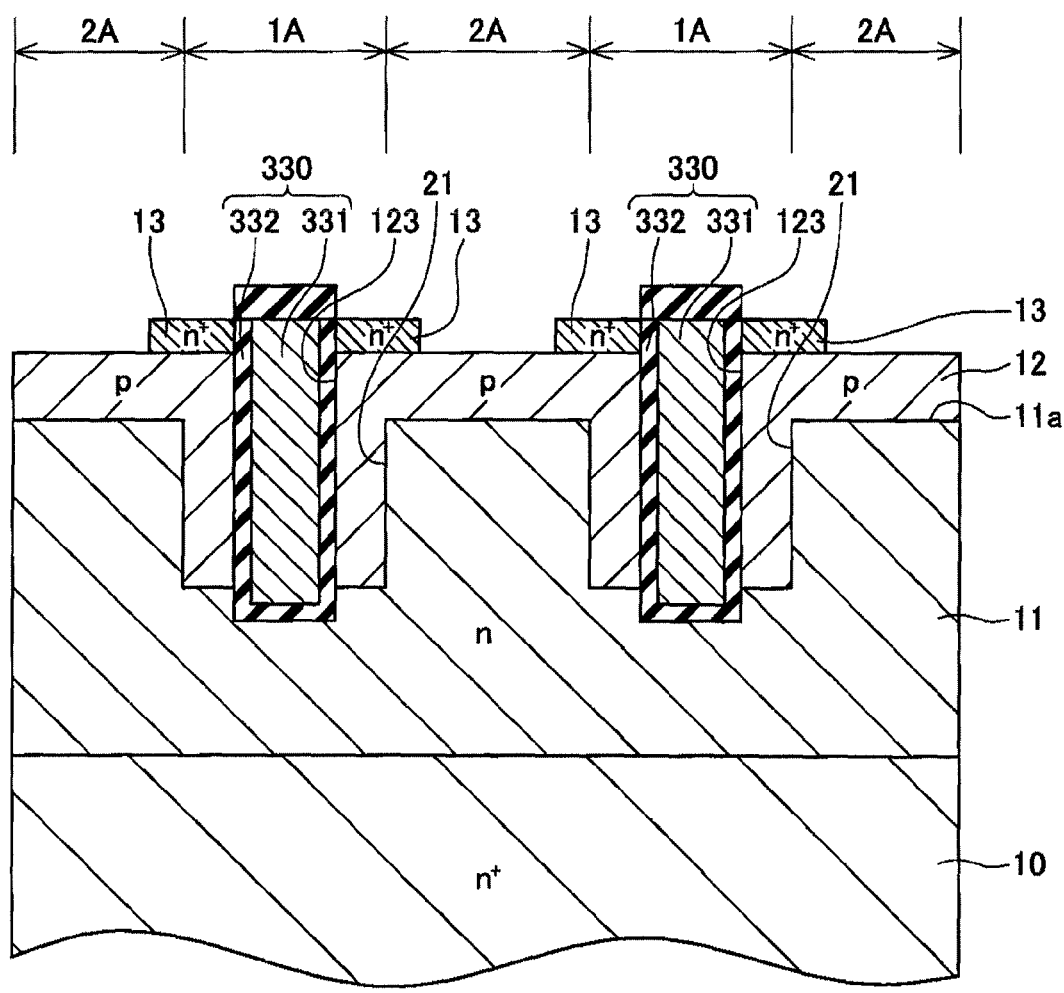
FIG. 23 schematically shows a cross-sectional view of a main part in one manufacturing process of the semiconductor device according to the modification of the second embodiment.

Next, as shown in FIG. 23, by using the etching technique, a part of the source layer 13 existing on the second area 2A of the surface 11a of the drift layer 11 is etched, and the base layer 12 is exposed.

Figure 24:
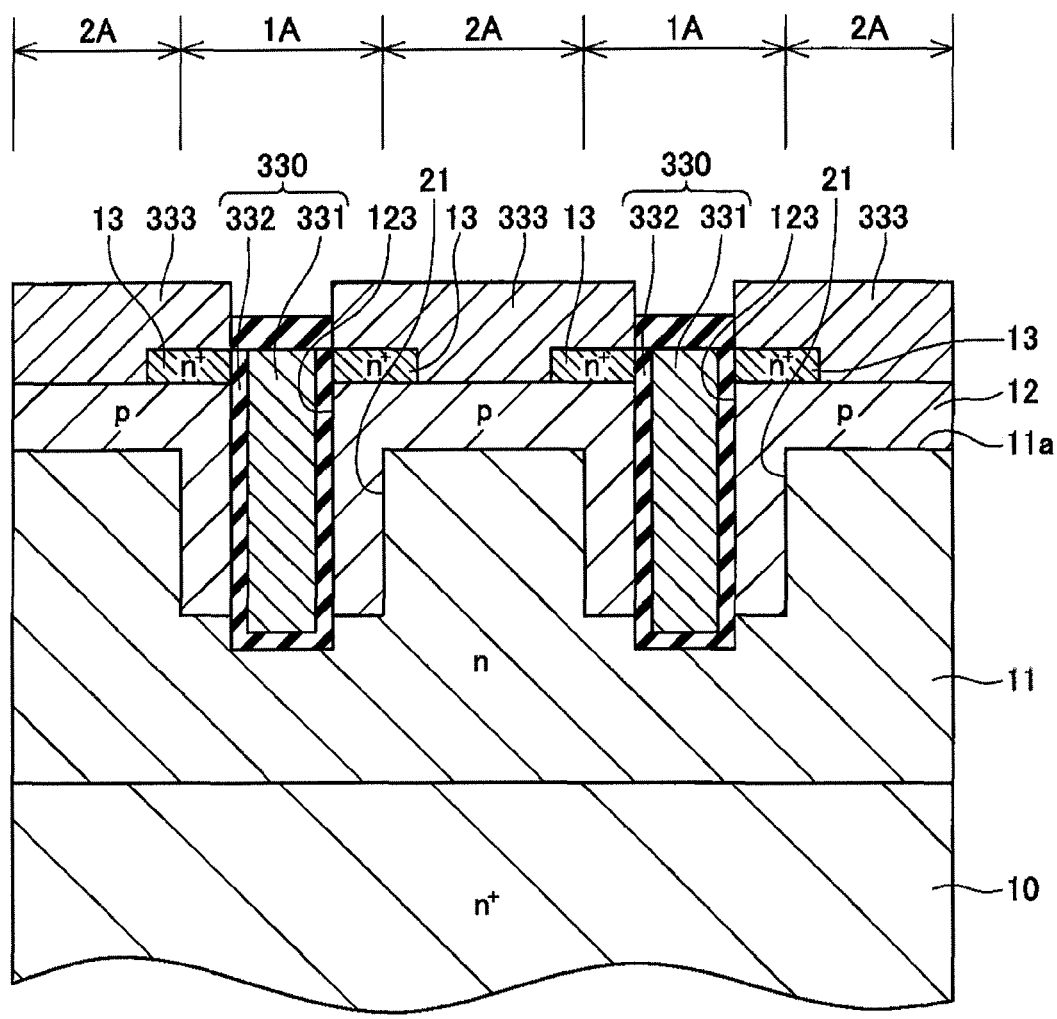
FIG. 24 schematically shows a cross-sectional view of a main part in one manufacturing process of the semiconductor device according to the modification of the second embodiment.

Next, as shown in FIG. 24, by using the vapor deposition technique, a source electrode 333 that is in ohmic contact with the source layer 13 and the base layer 12 is formed. In one example, a material of the source electrode 333 is nickel or nickel silicide.

Last, a drain electrode (not shown) is formed on the rear surface of the substrate 10, and the MOSFET is completed. According to the manufacturing method in the above modification, a MOSFET that uses silicon carbide as a material can be manufactured without positively using the ion implantation technique. Further, according to the MOSFET manufactured by the manufacturing method in the above modification, because the base layer 12 is present up to a position of the side surface of the third trench 123, an effect of suppressing latch up is high.

Third Embodiment

A method of manufacturing a MOSFET in a third embodiment is the same as the method of manufacturing a MOSFET in the first embodiment, up to the formation of the base layer 12 and the source layer 13 on the surface 11a of the drift layer 11 (see FIGS. 1 to 3).

Figure 25:
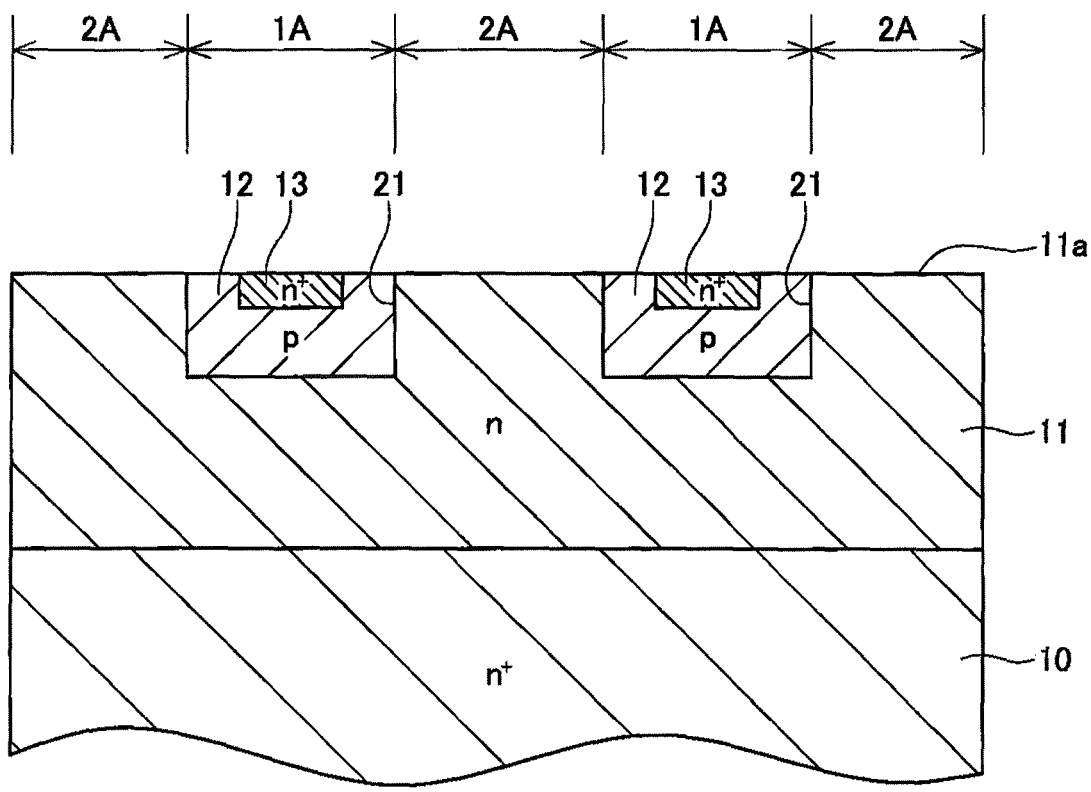
FIG. 25 schematically shows a cross-sectional view of a main part in one manufacturing process of a semiconductor device according to a third embodiment.

Next, as shown in FIG. 25, by using the etching technique, the source layer 13 is etched by a predetermined thickness from the surface. Specifically, by using the dry etching technique that uses chlorine as a material, the source layer 13, the base layer 12, and the drift layer 11 are removed until the source layer 13 and the base layer 12 are selectively left existing on the first area 1A of the surface 11a of the drift layer 11.

Figure 26:
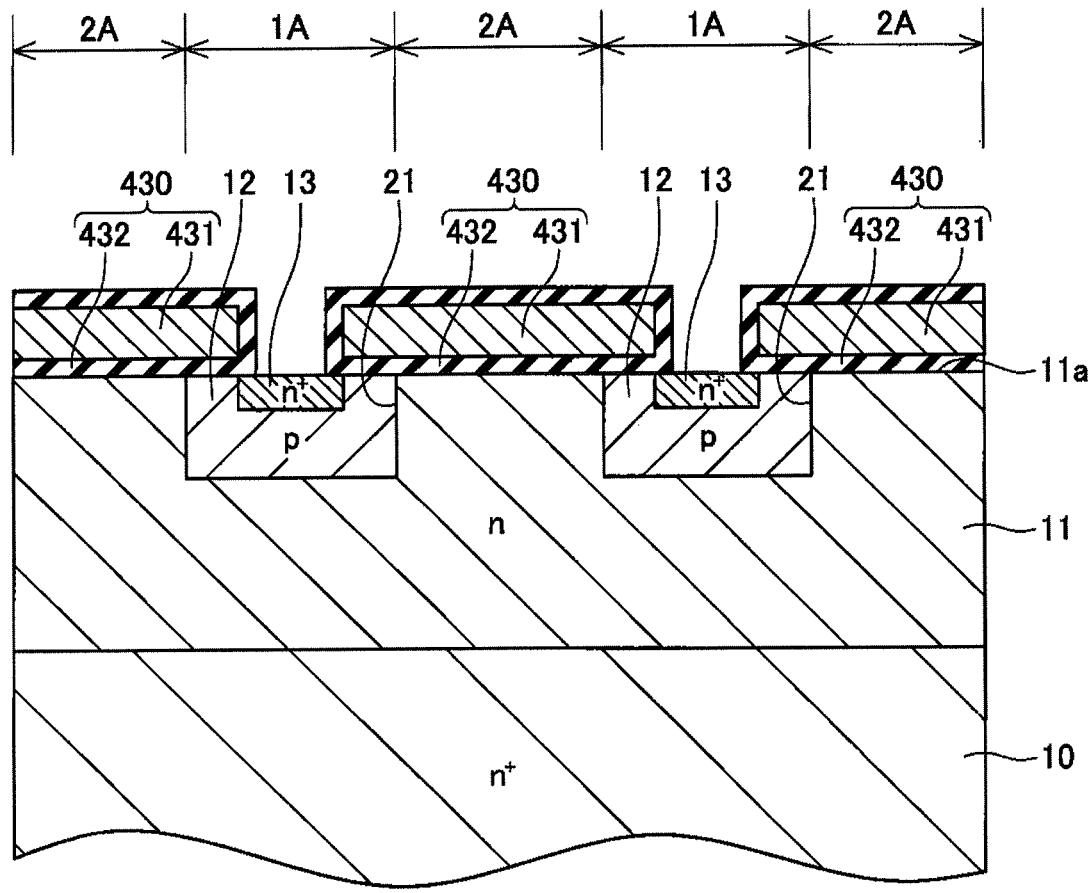
FIG. 26 schematically shows a cross-sectional view of a main part in one manufacturing process of the semiconductor device according to the third embodiment.

Next, as shown in FIG. 26, an insulated planar gate 430 that is opposite to the source layer 13, the base layer 12, and the drift layer 11 is formed in a state that a part of the source layer 13 is exposed. Specifically, after a gate insulated film 432 of silicon oxide is formed on the surfaces of the source layer 13, the base layer 12, and the drift layer 11 by using the thermal oxidation technique, a planar gate electrode 431 of polysilicon is formed on the gate insulated film 432 by using the vapor deposition technique.

Figure 27:
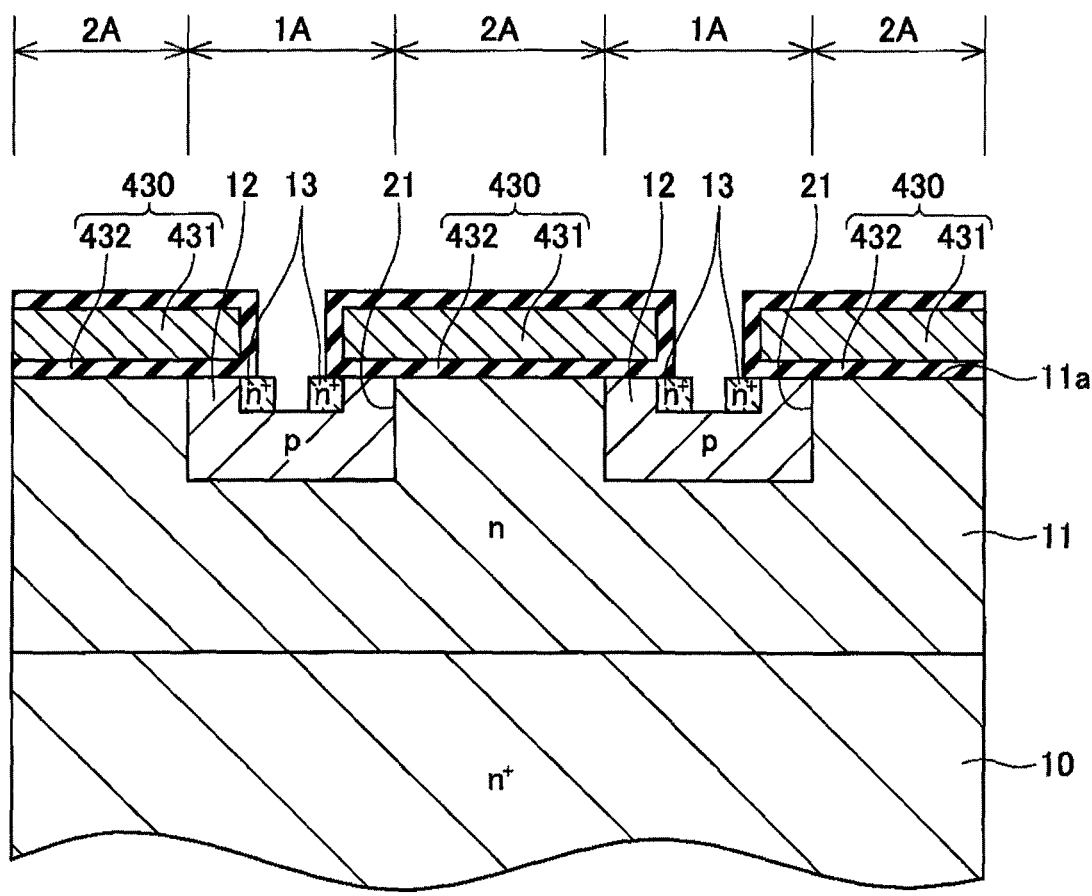
FIG. 27 schematically shows a cross-sectional view of a main part in one manufacturing process of the semiconductor device according to the third embodiment.

Next, as shown in FIG. 27, by using the etching technique, a part of the source layer 13 existing on the first area 1A of the surface 11a of the drift layer 11 is etched, and the base layer 12 is exposed.

Figure 28:
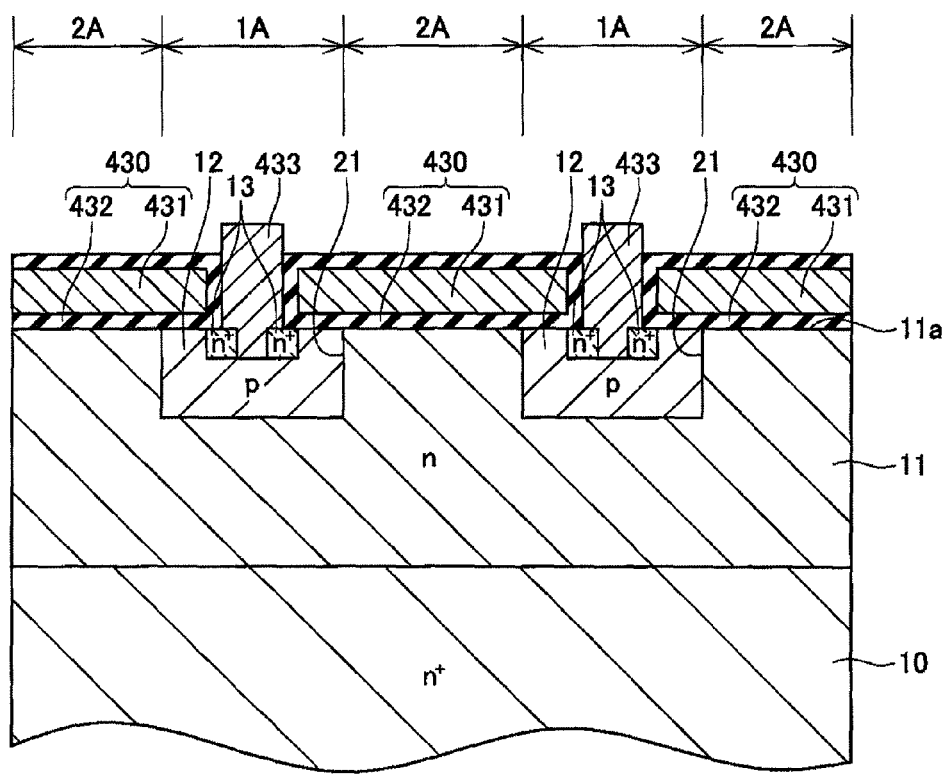
FIG. 28 schematically shows a cross-sectional view of a main part in one manufacturing process of the semiconductor device according to the third embodiment.

Next, as shown in FIG. 28, by using the vapor deposition technique, a source electrode 433 that is in ohmic contact with the source layer 13 and the base layer 12 is formed. In one example, a material of the source electrode 433 is nickel or nickel silicide.

Next, a drain electrode (not shown) is formed on the rear surface of the substrate 10, and the MOSFET is completed. According to the above manufacturing method, a MOSFET that uses silicon carbide as a material can be manufactured without positively using the ion implantation technique. Further, according to the MOSFET manufactured by the above manufacturing method, a MOSFET that includes the insulated planar gate 430 can be easily manufactured.

While concrete examples of the present invention are described in detail above, these are not more than exemplifications, and do not limit the scope of claims. The techniques described in claims include various modifications and alterations of the above exemplified concrete examples.

For example, in the above embodiments, although examples of forming the first trenches 21 and 121 in the drift layers 11 and 121 of the element regions of the MOSFET are described, the first trenches 21 and 121 may be formed in the termination region of the MOSFET. In this case, by filling the base layers 12 and 112 in the first trenches 21 and 121 formed in the termination region, filled results can be used as guard rings. A process of forming the guard ring in the termination region can be simplified.

Further, to improve an ohmic characteristic of the source electrode, a process of generating a high concentration region may be added by using the ion implantation technique.

The technical elements described in the present specification or the drawings exhibit technical utility independently or in various combinations, and are not limited to combinations described in claims at the time of application. Further, the techniques described in the present specification or the drawings can simultaneously achieve a plurality of objects, and have technical utility by itself by achieving one of the objects.

The invention claimed is:

1. A method of manufacturing a semiconductor device, the method comprising:
    forming a first trench in a semiconductor layer, wherein the semiconductor layer has a surface including a first area and a second area, and the first trench is formed in the first area;
    growing a crystal of a base layer of a first conductivity type on the surface of the semiconductor layer after forming the first trench;
    growing a crystal of a source layer of a second conductivity type on a surface of the base layer such that a reflected trench in which a configuration of the first trend is reflected is formed on the first area;
    forming a mask layer on a surface of the source layer;
    selectively leaving the mask layer existing in the reflected trench on the first area of the surface of the semiconductor layer by etching a predetermined thickness from a surface of the mask layer;
    forming a second trench which penetrates at least a part of the source and base layers existing on the second area of the surface of the semiconductor layer such that the semiconductor layer is exposed in the second trench; and
    forming an insulated trench gate in the second trench,
    wherein materials of the semiconductor layer, the base layer and the source layer are a wide gap semiconductor, and
    in the formation of the second trench, the second trench is formed by using the mask layer as a mask.

2. The method according to claim 1, further comprising:
    exposing the base layer by etching at least a part of the source layer existing on the first area of the surface of the semiconductor layer; and
    forming a source electrode contacting the exposed base layer.

3. The method according to claim 1, further comprising:
    forming a third trench which penetrates at least a part of the source and base layers existing on the first area of the surface of the semiconductor layer such that the semiconductor layer is exposed in the third trench; and
    forming an insulated trench gate in the third trench.

4. The method according to claim 3, wherein
    in the formation of the third trench, the third trench is formed so as to leave the source layer extending along a depth direction existing on a side surface of the third trench.

5. The method according to claim 3, wherein
    in the formation of the third trench, the third trench is formed so as not to leave the source layer extending along a depth direction existing on a side surface of the third trench.

6. The method according to claim 3, further comprising:
exposing the base layer by etching at least a part of the source layer existing on the second area of the surface of the semiconductor layer, and
forming a source electrode contacting the exposed base layer.

7. The method according to claim 1, further comprising:
selectively leaving the source and base layers existing on the first area of the surface of the semiconductor layer by etching a predetermined thickness from a surface of the source layer,
forming an insulated planar gate facing the base layer left existing on the first area of the surface of the semiconductor layer.

8. The method according to claim 1, wherein the wide gap semiconductor is silicon carbide.

* * * * *